(12) United States Patent
You

(10) Patent No.: US 12,178,088 B2
(45) Date of Patent: Dec. 24, 2024

(54) DISPLAY DEVICE INCLUDING DUMMY PATTERN OVERLAPPING ACTIVE PATTERN AND METHOD OF PROVIDING THE SAME

(71) Applicant: Samsung Display Co., LTD., Yongin-si (KR)

(72) Inventor: Chungi You, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 423 days.

(21) Appl. No.: 17/513,315

(22) Filed: Oct. 28, 2021

(65) Prior Publication Data

US 2022/0328592 A1 Oct. 13, 2022

(30) Foreign Application Priority Data

Apr. 9, 2021 (KR) .......................... 10-2021-0046562

(51) Int. Cl.
| | |
|---|---|
| *H10K 59/126* | (2023.01) |
| *H10K 59/12* | (2023.01) |
| *H10K 59/121* | (2023.01) |
| *H10K 59/131* | (2023.01) |
| *H10K 59/88* | (2023.01) |
| *H10K 71/00* | (2023.01) |

(52) U.S. Cl.
CPC ....... *H10K 59/126* (2023.02); *H10K 59/1213* (2023.02); *H10K 59/1216* (2023.02); *H10K 59/131* (2023.02); *H10K 59/88* (2023.02); *H10K 71/00* (2023.02); *H10K 59/1201* (2023.02)

(58) Field of Classification Search
CPC ............ H10K 59/126; H10K 59/1213; H10K 59/1216; H10K 59/131; H10K 59/88; H10K 59/1201; H10K 71/00
USPC .......................................................... 257/40
See application file for complete search history.

(56) References Cited

U.S. PATENT DOCUMENTS

2019/0221165 A1* 7/2019 Park ..................... G09G 3/3233
2020/0212152 A1* 7/2020 Chun ................... H10K 59/131

FOREIGN PATENT DOCUMENTS

| KR | 10-0576872 B1 | 5/2006 |
| KR | 1020160090949 A | 8/2016 |
| KR | 1020200012062 A | 2/2020 |
| KR | 1020200016425 A | 2/2020 |

* cited by examiner

*Primary Examiner* — Matthew E. Gordon
(74) *Attorney, Agent, or Firm* — CANTOR COLBURN LLP

(57) ABSTRACT

A display device includes a substrate, an active pattern on the substrate and including a first region, a second region spaced apart from the first region, and a third region between the first region and the second region, a first conductive pattern layer on the active pattern and including a first dummy portion overlapping the third region of the active pattern and a first conductive pattern which is spaced apart from the first dummy portion, and a plurality of second conductive patterns on the first conductive pattern layer, where the first dummy portion of the first conductive pattern layer is electrically insulated from the plurality of second conductive patterns and the active pattern.

15 Claims, 22 Drawing Sheets

FIG. 8
ATV+C1+C2+C3
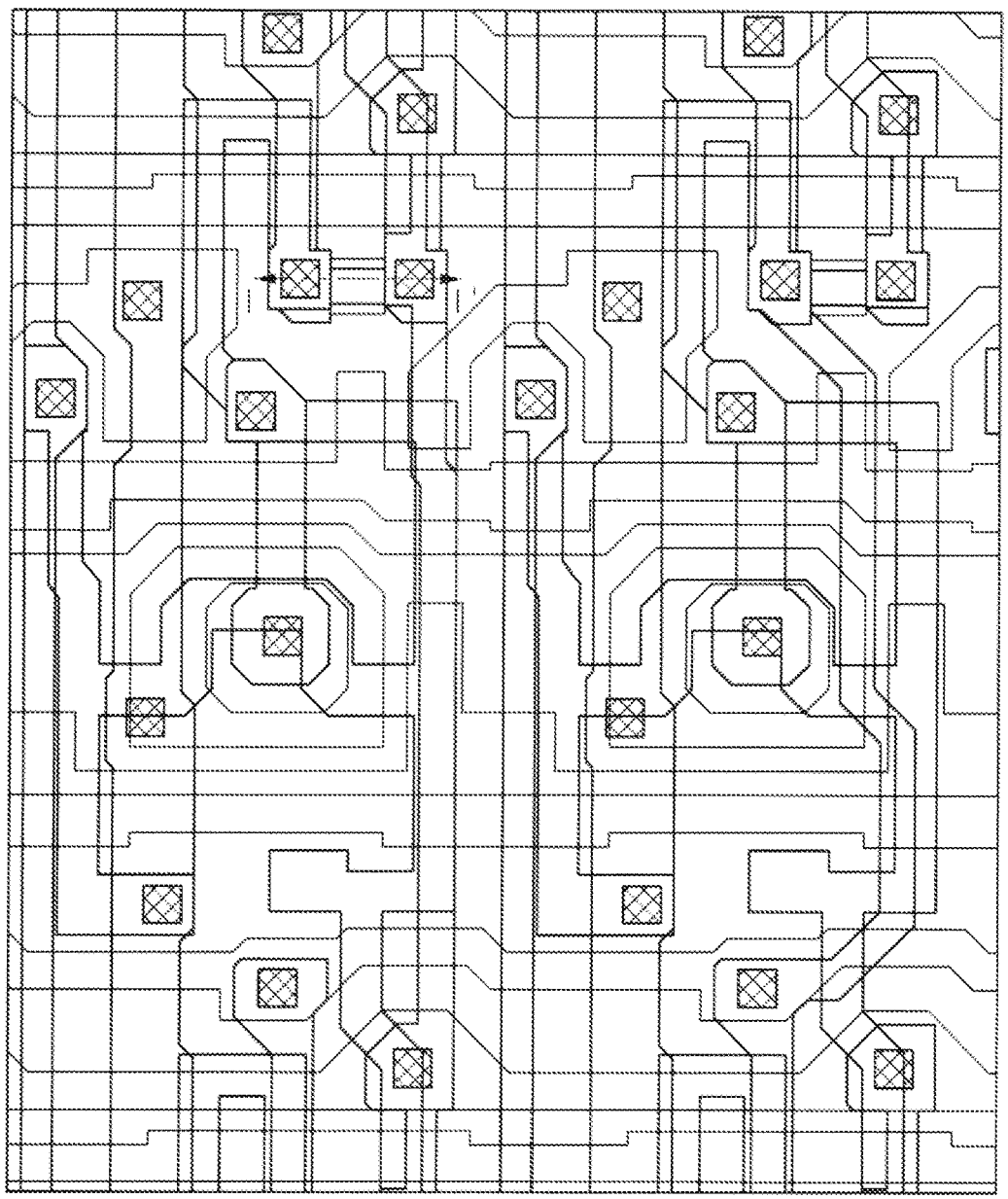
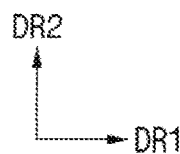

FIG. 18
ATV+C1+C2+C3+C4
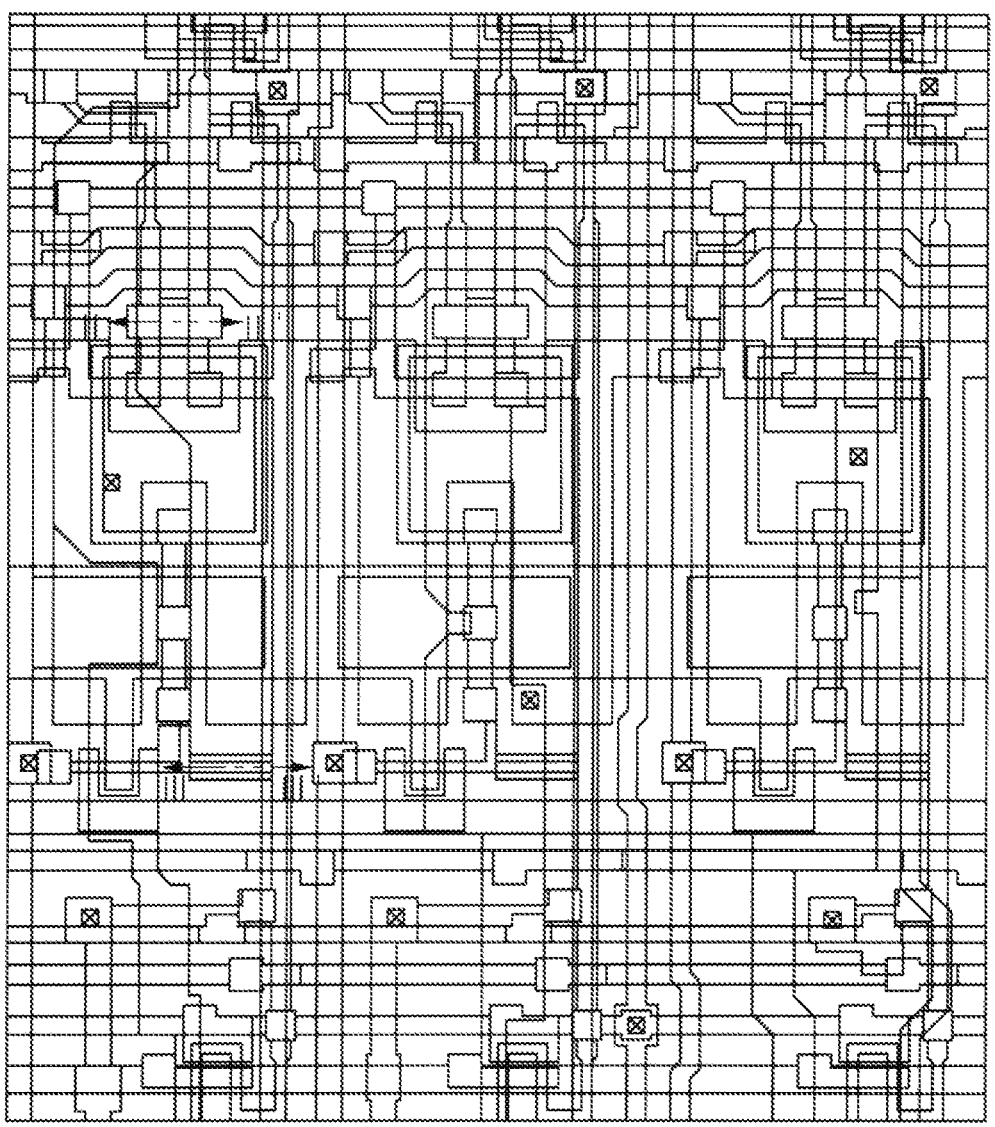

DISPLAY DEVICE INCLUDING DUMMY PATTERN OVERLAPPING ACTIVE PATTERN AND METHOD OF PROVIDING THE SAME

This application claims priority to Korean Patent Application No. 10-2021-0046562, filed on Apr. 9, 2021, and all the benefits accruing therefrom under 35 U.S.C. § 119, the contents of which are herein incorporated by reference in their entirety.

BACKGROUND

1. Field

The present disclosure relates to a display device. More specifically, the present disclosure relates to a display device and a method of providing or manufacturing the display device.

2. Description of the Related Art

A display device may include a plurality of pixels. Each of the plurality of pixels may emit light. Each of the plurality of pixels may include a pixel circuit for emitting light. The pixel circuit may include an active pattern and a plurality of conductive layers which are on the active pattern. In this case, static electricity may be generated from an active pattern of the pixel circuit, so that the pixel circuit may be damaged. If the pixel circuit is damaged, the display performance of the display device may be lowered.

SUMMARY

One or more embodiment of the present disclosure provides a display device capable of improving display performance.

One or more embodiment provides a method of providing or manufacturing a display device capable of improving display performance.

However, embodiments are not limited to the above effects, and may be variously expanded without departing from the spirit and scope of the present disclosure.

An embodiment of a display device includes a substrate, an active pattern on the substrate and including a first region, a second region spaced apart from the first region, and a third region between the first region and the second region, a first conductive pattern on the active pattern and including a first dummy portion overlapping the third region of the active pattern and a conductive portion spaced apart from the first dummy portion, and a plurality of conductive patterns on the first conductive pattern, where the first dummy portion of the first conductive pattern is electrically insulated from the plurality of conductive patterns and the active pattern.

In an embodiment, the active pattern and the conductive portion of the first conductive pattern may define a transistor.

In an embodiment, the third region of the active pattern may electrically insulate the first region of the active pattern from the second region of the active pattern.

In an embodiment, the first dummy portion of the first conductive pattern may not overlap the first region and the second region of the active pattern.

In an embodiment, the first dummy portion of the first conductive pattern may be electrically insulated from the conductive portion of the first conductive pattern.

In an embodiment, the plurality of conductive patterns may include a second conductive pattern on the first conductive pattern, and a third conductive pattern on the second conductive pattern.

In an embodiment, the plurality of conductive patterns may further include a fourth conductive pattern on the third conductive pattern.

In an embodiment, the display device may further include a driving transistor configured to generate a driving current, a light emitting diode configured to emit light based on the driving current, a driving initialization transistor configured to provide a first initialization voltage to a gate electrode of the driving transistor, and a diode initialization transistor configured to provide a second initialization voltage different from the first initialization voltage to an anode electrode of the light emitting diode.

In an embodiment, the first region may be an input electrode of the driving initialization transistor, and the second region may be an input electrode of the diode initialization transistor.

In an embodiment, the display device may further include a first initialization voltage line configured to transmit the first initialization voltage and electrically connected to the first region, and a second initialization voltage line configured to transmit the second initialization voltage and electrically connected to the second region.

In an embodiment, the display device may further include a driving transistor configured to generate a driving current, a storage capacitor including a first electrode connected to a gate electrode of the driving transistor and a second electrode overlapping the first electrode, a light emitting diode configured to emit light based on the driving current, an initialization transistor configured to provide an initialization voltage to the first electrode of the storage capacitor, and a reference transistor configured to provide a reference voltage to the second electrode of the storage capacitor.

In an embodiment, the first region may be an output electrode of the reference transistor, and the second region may be an output electrode of the initialization transistor.

In an embodiment, the display device may further include an initialization voltage line configured to transmit the initialization voltage and electrically connected to an input electrode of the initialization transistor, and a reference voltage line configured to transmit the reference voltage and electrically connected to an input electrode of the reference transistor.

In an embodiment, the active pattern may further include a fourth region, a fifth region spaced apart from the fourth region, and a sixth region between the fourth region and the fifth region, the first conductive pattern may further include a second dummy portion overlapping the sixth region of the active pattern, and the second dummy portion of the first conductive pattern may be electrically insulated from the plurality of conductive patterns and the active pattern.

In an embodiment, the display device may further include a switching transistor configured to provide a data voltage to the second electrode of the storage capacitor, and a light emission control transistor configured to receive the driving current from the driving transistor to transfer the driving current to the light emitting diode.

In an embodiment, the fourth region may be an output electrode of the switching transistor, and the fifth region may be an input electrode of the light emission control transistor.

An embodiment includes a method of providing or manufacturing a display device including providing an active pattern including a first region, a second region spaced apart from the first region, and a third region between the first region and the second region on a substrate, providing a first conductive pattern including a dummy portion overlapping the third region of the active pattern and a conductive portion spaced apart from the dummy portion on the active pattern, doping the active pattern with impurities using the first conductive pattern as a mask, and providing a plurality of conductive patterns on the first conductive pattern, in which the dummy portion is electrically insulated from the active pattern and the plurality of conductive patterns.

In an embodiment, the third region of the active pattern may not be doped with the impurities.

In an embodiment, the dummy portion of the first conductive pattern may be electrically insulated from the conductive portion of the first conductive pattern.

In an embodiment, the dummy portion of the first conductive pattern may not overlap the first region and the second region of the active pattern.

As described above, one or more embodiment of the display device may include an active pattern including a third region and a first conductive pattern including a first dummy portion overlapping the third region and electrically insulated from the active pattern and a plurality of conductive layers. Accordingly, static electricity generated from the active pattern can be relatively reduced, so that display performance of the display device can be improved.

As described above, in one or more embodiment of the method of providing a display device, the first conductive pattern including the first dummy portion overlapping the third region and electrically insulated from the active pattern and a plurality of conductive layers may be provided on the active pattern including the third region and the active pattern may be doped with impurities by using the first conductive pattern as a mask.

Accordingly, static electricity generated from the active pattern can be relatively reduced in the process of providing the display device, so that a method of providing a display device capable of improving display performance can be provided.

However, the effects of the present disclosure may not be limited to the above-described effects, and may be variously expanded without departing from the spirit and scope of the present disclosure.

BRIEF DESCRIPTION OF THE DRAWINGS

The above and other advantages and features of this disclosure will become more apparent by describing in further detail embodiments thereof with reference to the accompanying drawings, in which:

FIGS. 3 to 9 are views for explaining an embodiment of a pixel circuit included in a plurality of pixels adjacent to each other.

FIGS. 11 to 20 are views for explaining an embodiment of a pixel circuit included in a plurality of pixels adjacent to each other.

DETAILED DESCRIPTION

Figure 1:
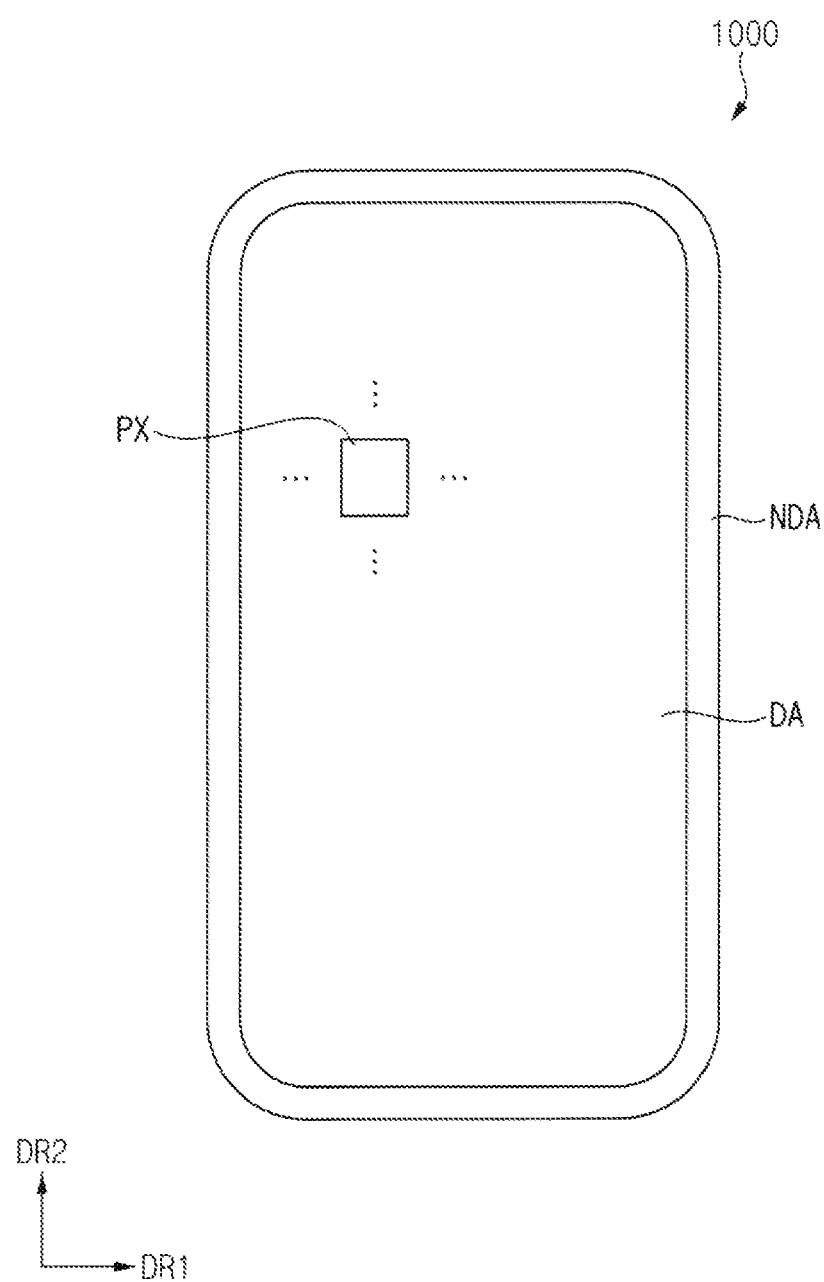
FIG. 1 is a plan view illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. The same or similar reference numerals will be assigned to the same components in the accompanying drawings. As used herein, a reference number may indicate a singular element or a plurality of the element. For example, a reference number labeling a singular form of an element within the drawing figures may be used to reference a plurality of the singular element within the text of specification.

It will be understood that when an element is referred to as being related to another element such a being "on" another element, it can be directly on the other element or intervening elements may be present therebetween. In contrast, when an element is referred to as being related to another element such a being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a display device 1000 and a method of providing or manufacturing the display device 1000 will be described in more detail with reference to the accompanying drawings.

FIG. 1 is a plan view illustrating an embodiment of a display device 1000.

Referring to FIG. 1, a display device 1000 may include a display area DA and a non-display area NDA.

The display area DA may be an area in which an image is displayed in the display device 1000. The display device 1000 may include a pixel PX provided in plural including a plurality of pixels PX in the display area DA. The pixels PX may be arranged in a matrix form in or along a first direction DR1 and a second direction DR2 which intersects the first direction DR1. The pixels PX may be arranged in rows and columns within the matrix form, without being limited thereto. Each of the plurality of pixels PX may emit light. The display device 1000 may display an image by combining light emitted from each of the plurality of pixels PX.

The non-display area NDA may be an area in which an image is not displayed in the display device 1000. The non-display area NDA may be adjacent to the display area DA. A driving unit for driving the plurality of pixels PX may be disposed on the non-display area NDA. The driving unit may be electrically connected to the plurality of pixels PX.

A thickness of the display device 1000 and various elements or layers thereof, may be taken in a third direction crossing each of the first direction DR1 and the second direction DR2 to define a thickness direction.

Figure 2:
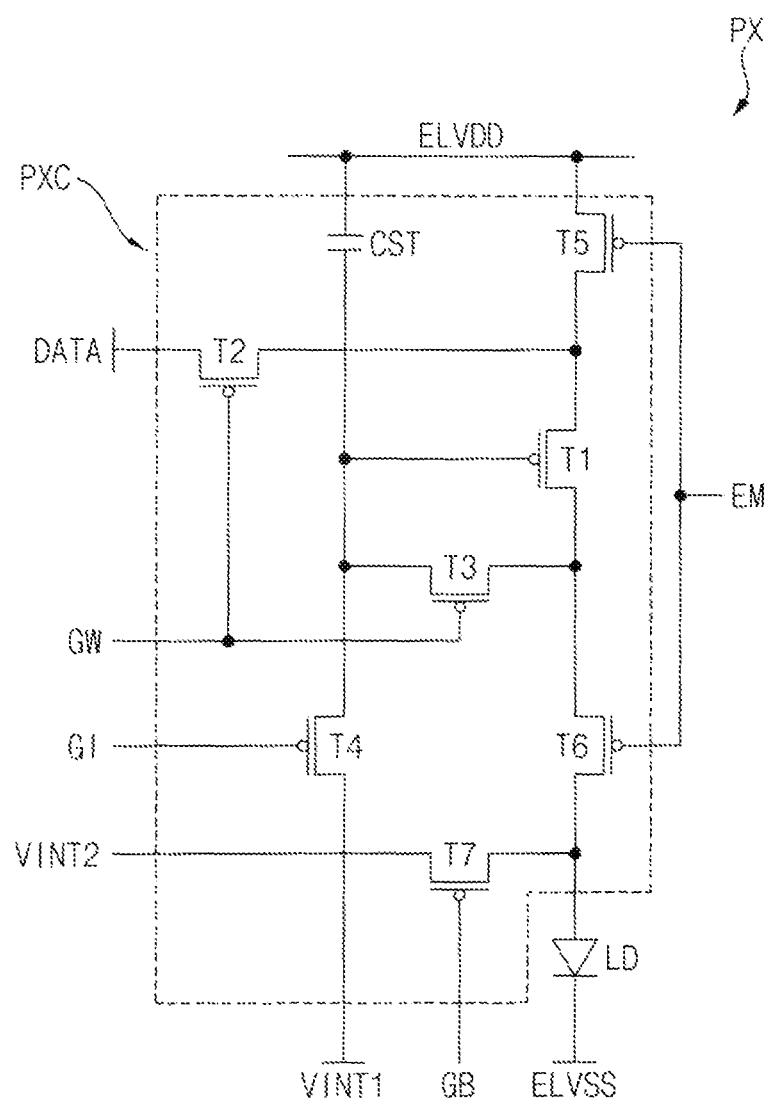
FIG. 2 is a circuit diagram illustrating an embodiment of a pixel shown in FIG. 1.

FIG. 2 is a circuit diagram illustrating an embodiment of the pixel PX of FIG. 1.

Referring to FIG. 2, the pixel PX may include a pixel circuit PXC and a light emitting diode LD (e.g., light emitting element). The pixel circuit PXC may include first to seventh transistors T1, T2, T3, T4, T5, T6, and T7 and a storage capacitor CST.

The first transistor T1 may be electrically connected to a first power voltage line ELVDD and an anode electrode of the light emitting diode LD to transmit a driving current corresponding to a data signal provided from a data line DATA to the light emitting diode LD. In other words, the first transistor T1 may be a driving transistor.

The second transistor T2 may be connected between the data line DATA and an input electrode of the first transistor T1 to transmit the data signal to an input electrode of the first transistor T1 in response to a scan signal provided from a scan line GW. In other words, the second transistor T2 may be a switching transistor.

The third transistor T3 may be connected between a gate electrode of the first transistor T1 and an output electrode of the first transistor T1 to diode-connect the first transistor T1 in response to the scan signal, thereby compensating for the threshold voltage of the first transistor T1. In other words, the third transistor T3 may be a compensation transistor.

The fourth transistor T4 may be connected between a first initialization voltage line VINT' and the gate electrode of the first transistor T1 to provide a first initialization voltage provided from the initialization voltage line VINT' to the gate electrode of the first transistor T1 in response to a first initialization control signal provided from a first initialization control line GI. In other words, the fourth transistor T4 may be a driving initialization transistor.

The fifth transistor T5 may be connected between the first power voltage line ELVDD and the input electrode of the first transistor T1, and the sixth transistor T6 may be connected between the output electrode of the first transistor T1 and an anode electrode of the light emitting diode LD. Each of the fifth transistor T5 and the sixth transistor T6 may provide the driving current to the anode electrode of the light emitting diode LD in response to a light emission control signal provided from a light emission control line EM. In other words, each of the fifth transistor T5 and the sixth transistor T6 may be a light emission control transistor.

The seventh transistor T7 may be connected between a second initialization voltage line VINT2 and the anode electrode of the light emitting diode LD to provide a second initialization voltage provided from the second initialization voltage line VINT2 to the anode electrode of the light emitting diode LD in response to a second initialization control signal provided from the second initialization control line GB. In other words, the seventh transistor T7 may be a diode initialization transistor. A voltage level of the second initialization voltage may be different from a voltage level of the first initialization voltage. In an embodiment, the voltage level of the second initialization voltage may be lower than the voltage level of the first initialization voltage.

In an embodiment, an input electrode and an output electrode of each of the transistors T1, T2, T3, T4, T5, T6, and T7 may be a source electrode and a drain electrode, respectively. However, the present disclosure is not limited thereto, and the input electrode and the output electrode of each of the transistors T1, T2, T3, T4, T5, T6, and T7 may be a drain electrode and a source electrode, respectively.

The storage capacitor CST may be connected between the first power voltage line ELVDD and the gate electrode of the first transistor T1. In an embodiment, for example, a first electrode of the storage capacitor CST may be connected to the gate electrode of the first transistor T1, and a second electrode of the storage capacitor CST may be connected to the first power voltage line ELVDD. The storage capacitor CST may hold a voltage between the first power voltage line ELVDD and the gate electrode of the first transistor T1.

The light emitting diode LD may be connected between an output electrode of the sixth transistor T6 and a second power voltage line ELVSS. The light emitting diode LD may emit light based on the driving current.

In the present embodiment, since the first initialization voltage line VINT' providing the first initialization voltage applied to the fourth transistor T4 is separated from the second initialization voltage line VINT2 providing the second initialization voltage applied to the seventh transistor T7, the first transistor T1 and the light emitting diode LD may be initialized by mutually different voltages.

Figure 3:
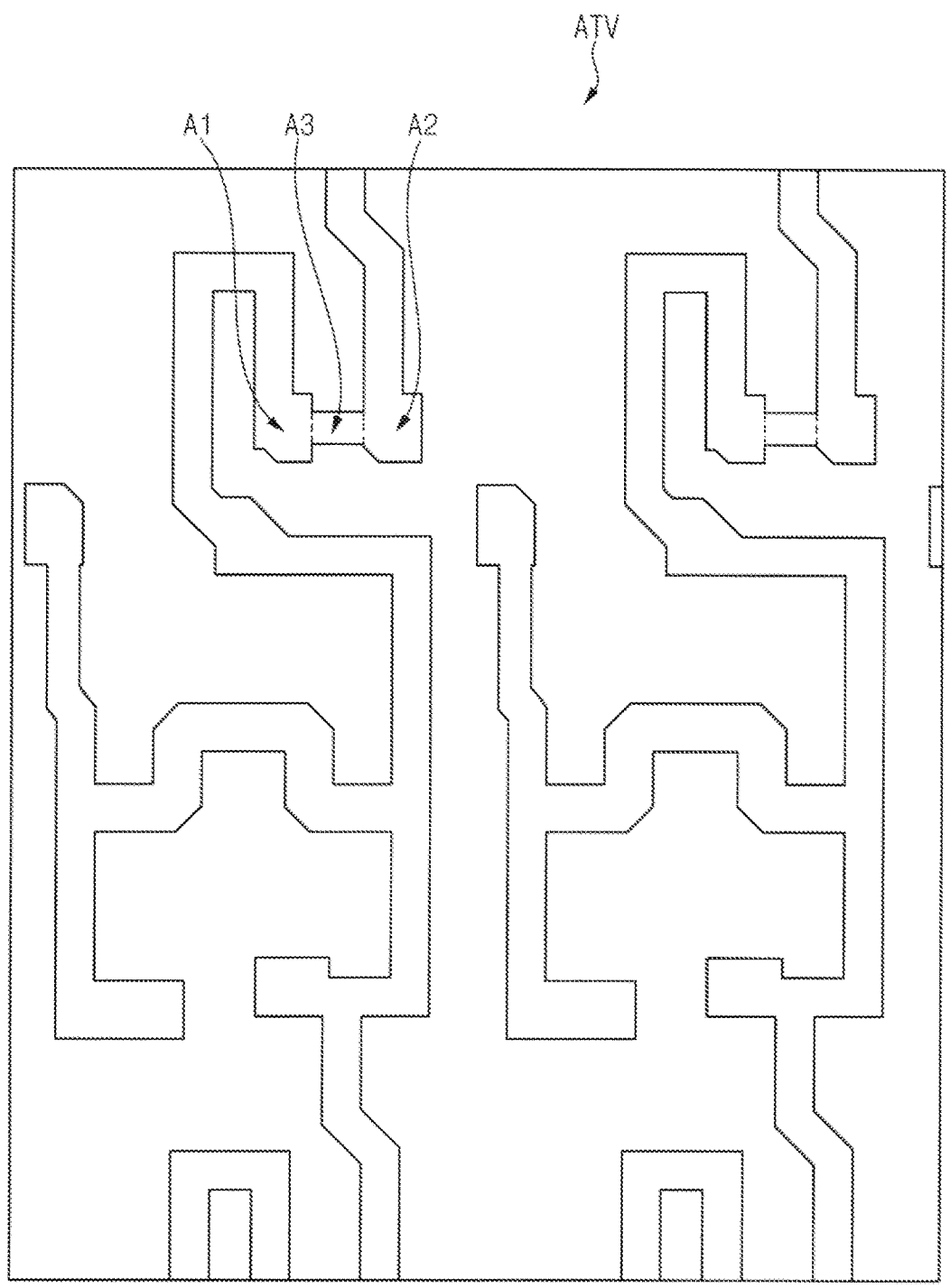
Figure 4:
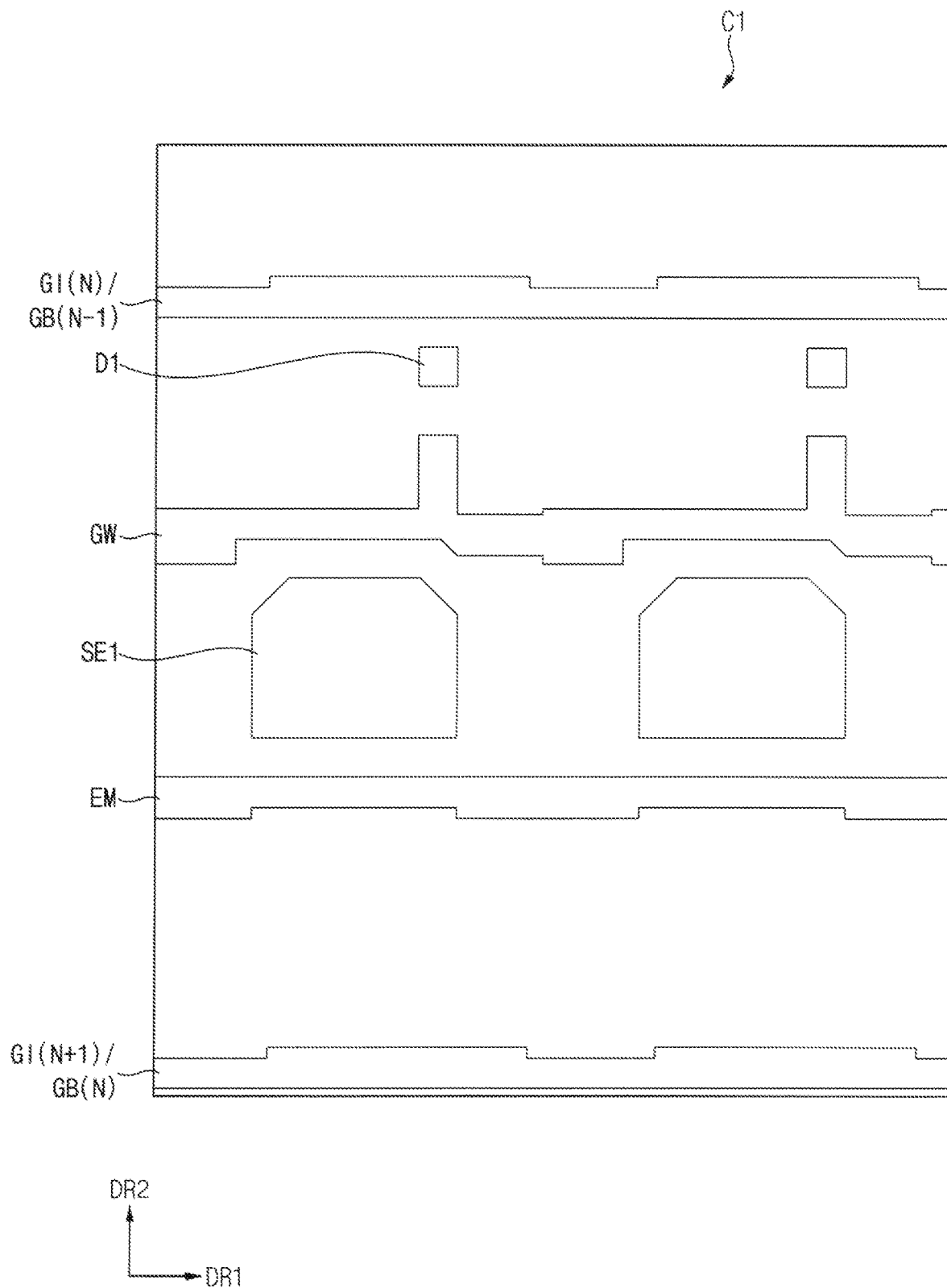
Figure 5:
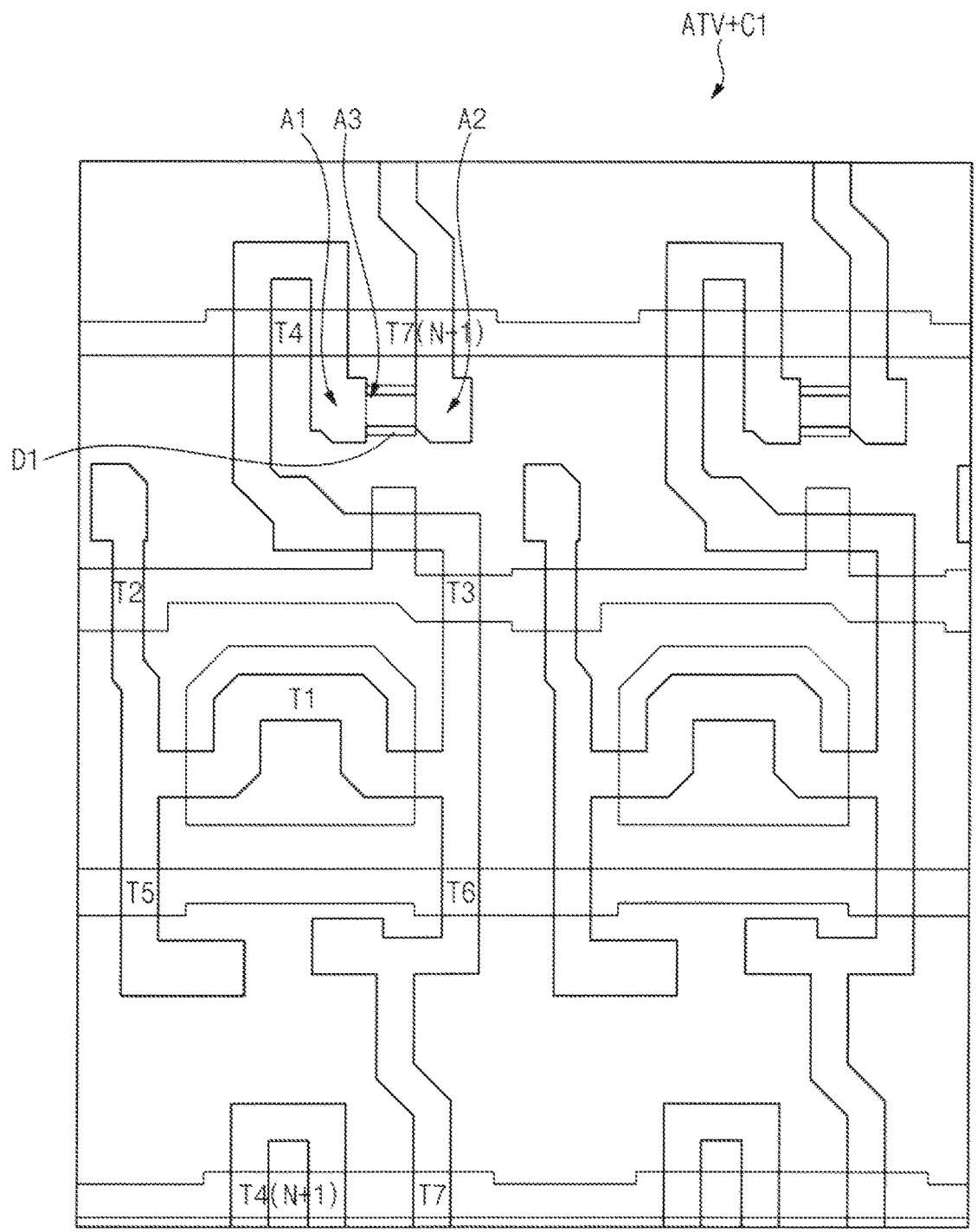
Figure 6:
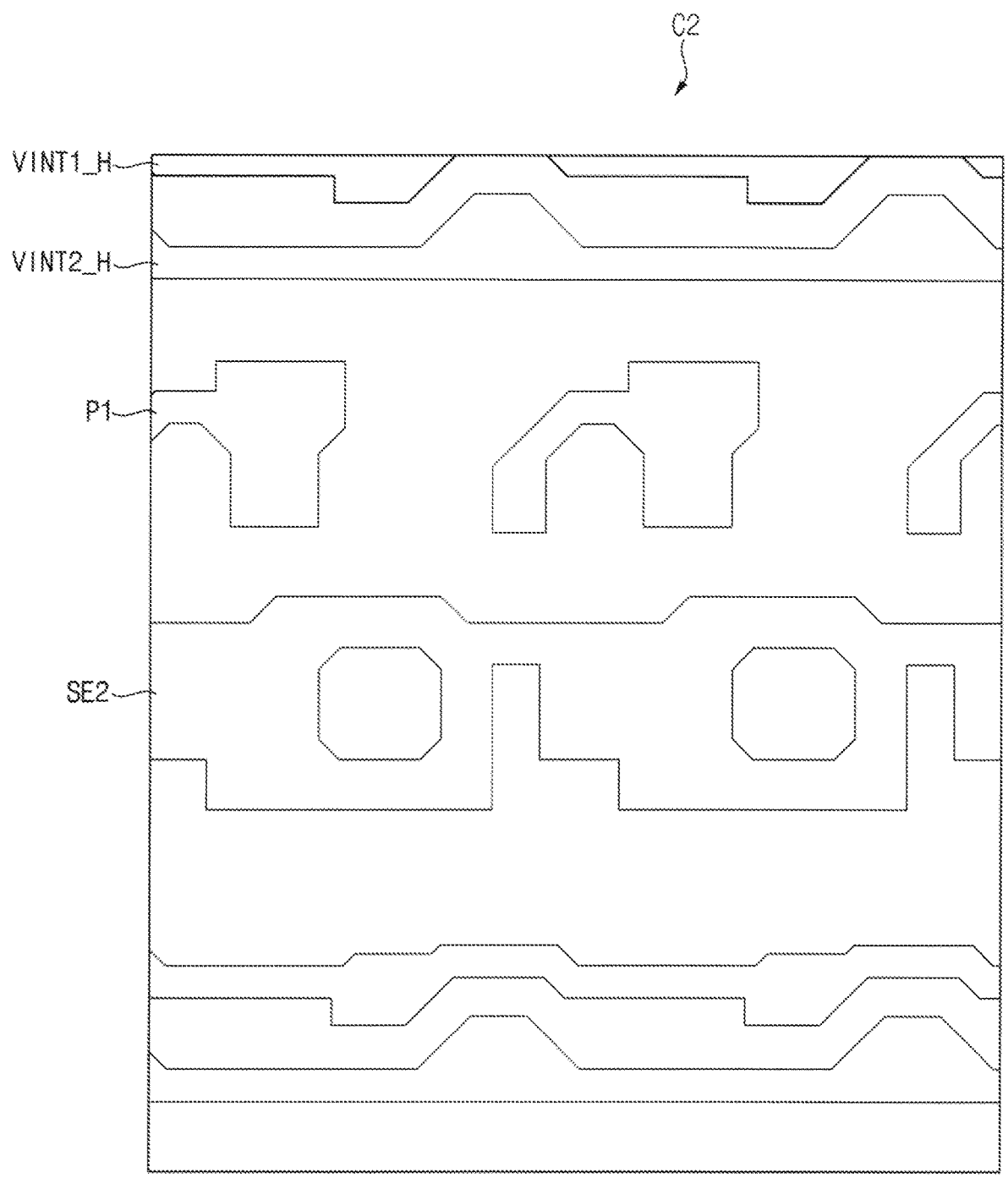
Figure 7:
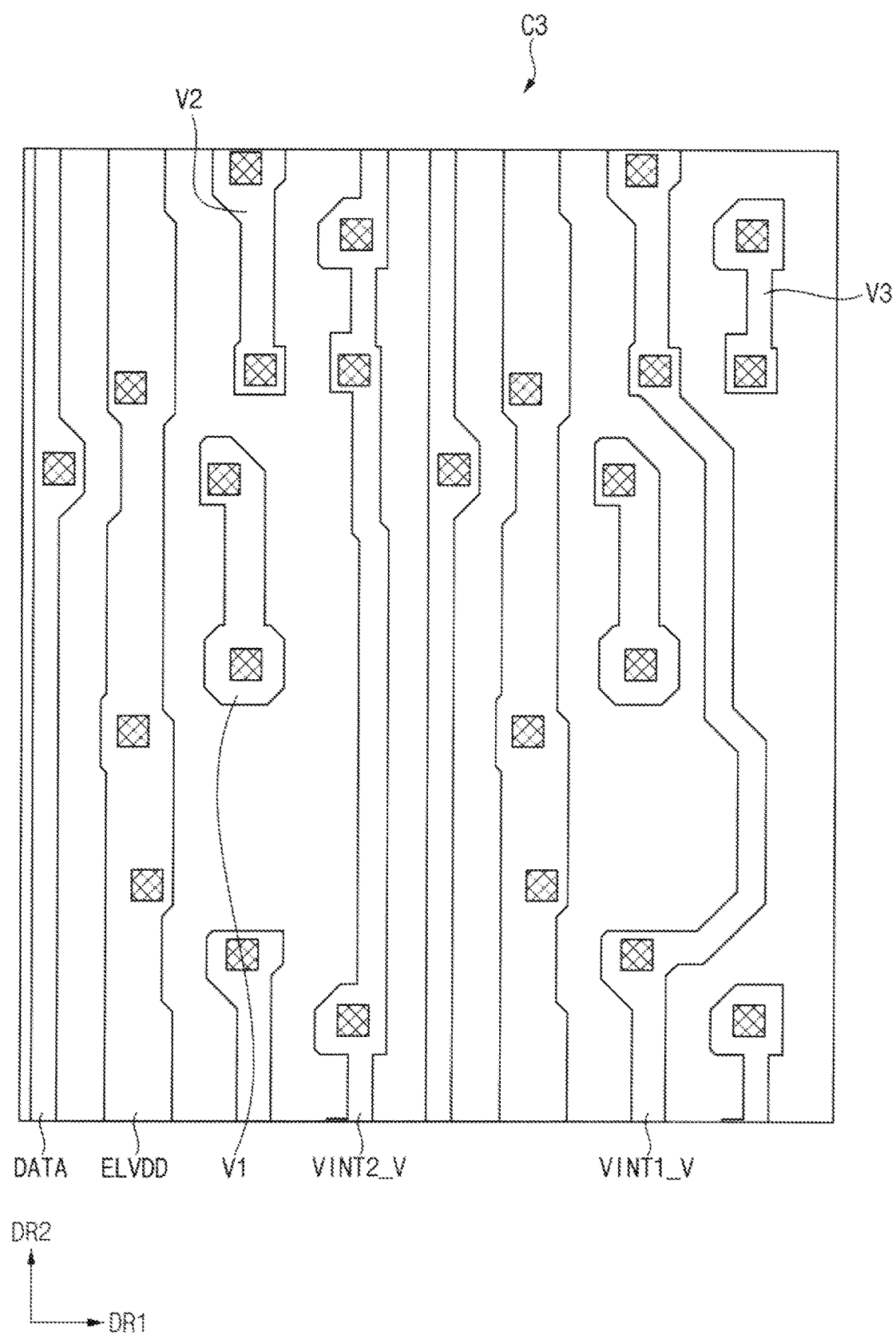
Figure 9:
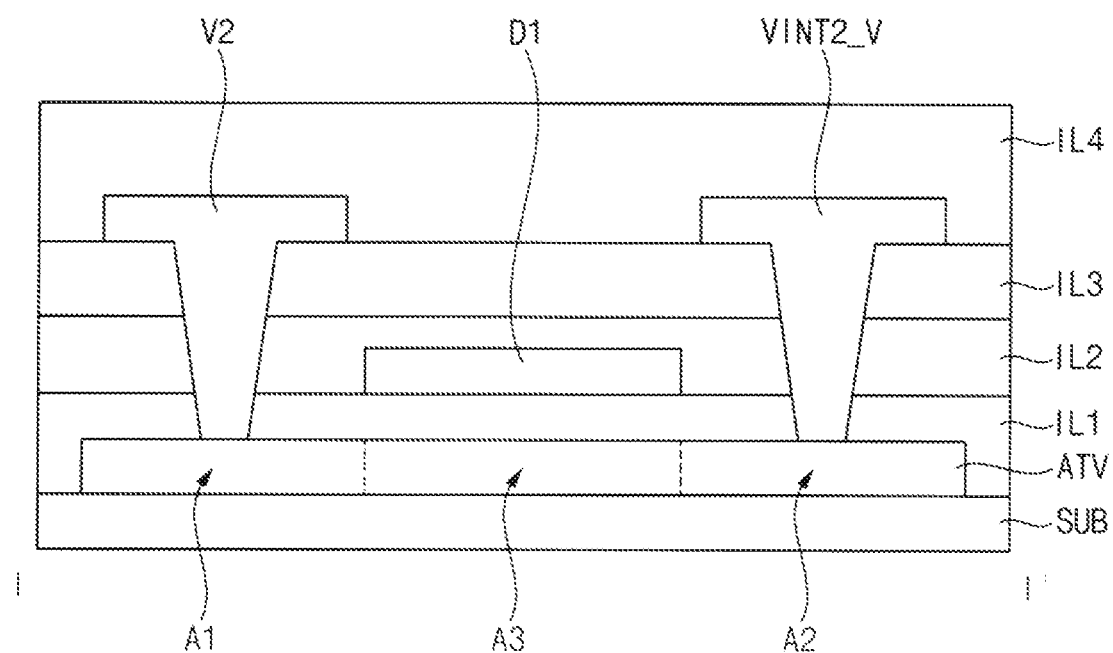

FIGS. 3 to 9 are views for explaining embodiments of a pixel circuit PXC included in a plurality of pixels PX adjacent to each other. FIG. 3 is a plan view illustrating an embodiment of an active pattern ATV. FIG. 4 is a plan view illustrating an embodiment of a first conductive pattern C1. FIG. 5 is a plan view illustrating an embodiment of the active pattern ATV relative to the first conductive pattern C1. FIG. 6 is a plan view illustrating an embodiment of a second conductive pattern C2. FIG. 7 is a plan view illustrating an embodiment of a third conductive pattern C3. FIG. 8 is a plan view illustrating an embodiment of the active pattern ATV, the first conductive pattern C1, the second conductive pattern C2 and the third conductive pattern C3 together. FIG. 9 is a cross-sectional view taken along line I-I' of FIG. 8. A connection area or connection point between layers in a plan view of the pixel circuit PXC may be indicated by a shape filled with a hatch pattern or having an "X" therein, without being limited thereto.

Referring to FIGS. 3 to 9, the pixel circuit PXC may include a substrate SUB, an active pattern ATV disposed on the substrate SUB, a first conductive pattern C1 disposed on the active pattern ATV, and a plurality of conductive patterns disposed on the first conductive pattern C1. The plurality of conductive patterns may include a second conductive pattern C2 disposed on the first conductive pattern C1 and a third conductive pattern C3 disposed on the second conductive pattern C2. A plurality of conductive patterns as respective patterns of a same material layer may be in a same layer as each other and together form a conductive pattern layer.

A first insulating layer IL1 may be disposed between the active pattern ATV and the first conductive pattern C1. A second insulating layer IL2 may be disposed between the first conductive pattern C1 and the second conductive pattern C2. A third insulating layer IL3 may be disposed between the second conductive pattern C2 and the third conductive pattern C3. A fourth insulating layer IL4 covering the third conductive pattern C3 may be disposed on the third insulating layer IL3. That is, the active pattern ATV, the first insulating layer IL', the first conductive pattern C1, the second insulating layer IL2, the second conductive pattern C2, the third insulating layer IL3, the third conductive pattern C3 and the fourth insulating layer IL4 may be in order from the substrate SUB along the thickness direction.

The first to third conductive patterns C1, C2, and C3 may include a conductive material. In an embodiment, for example, the conductive material may include a metal, an alloy, a metal nitride, a conductive metal oxide, a transparent conductive material, and the like.

Referring again to FIG. 3, the active pattern ATV may include polycrystalline silicon. Alternatively, the active pattern ATV may include an oxide semiconductor. In an embodiment, for example, the oxide semiconductor may include at least one selected from indium (In), gallium (Ga), tin (Sn), zirconium (Zr), vanadium (V), hafnium (Hf), cadmium (Cd), germanium (Ge), chromium (Cr), titanium (Ti), and zinc (Zn).

The active pattern ATV may include a first region A1, a second region A2, and a third region A3. The second region A2 may be spaced apart from the first region A1 in a direction along the substrate SUB. The third region A3 may be located between the first region A1 and the second region A2. In one embodiment, the first region A1 may be an input electrode of the fourth transistor T4 of a pixel PX, and the second region A2 may be an input electrode of the seventh transistor T7(N−1). In an embodiment, for example, the fourth transistor T4 may be included in a pixel PX of an $N^{th}$ row within the display area DA, and the seventh transistor T7(N−1) may be included in a pixel PX of an $(N-1)^{th}$ row within the display area DA.

The third region A3 may have relatively low electrical conductivity. Accordingly, the third region A3 of the active pattern ATV may electrically insulate the first region A1 of the active pattern ATV from the second region A2 of the active pattern ATV.

Referring again to FIGS. 4 and 5, the first conductive pattern C1 as a first conductive pattern layer may include a first dummy portion D1 and a conductive portion which is spaced apart from the first dummy portion D1. The conductive portion may be patterns of the first conductive pattern C1 except for the first dummy portion D1. The conductive portion may include an initialization control line GI(N)/GB(N−1), a scan line GW, a first storage electrode SE1, and a light emission control line EM. The conductive portion may overlap the active pattern ATV to define a transistor. That is, the pixel circuit PXC may further include a transistor defined by the active pattern ATV and the conductive portion of a first conductive pattern layer (e.g., the first conductive pattern C1).

The initialization control lines GI(N)/GB(N−1) may extend in the first direction DR1. The initialization control line GI(N)/GB(N−1) may overlap a portion of the active pattern ATV. The overlapping portion between the initialization control line GI(N)/GB(N−1) and the active pattern ATV may define the seventh transistor T7(N−1) included in the pixel of the $(N-1)^{th}$ row of the fourth transistor T4 included in the pixel of the $N^{th}$ row. The first initialization control signal may be provided to a gate electrode of the fourth transistor T4 included in the pixel of the $N^{th}$ row through the initialization control line GI(N)/GB(N−1), and the second initialization control signal may be provided to the gate electrode of the seventh transistor T7(N−1) included in the pixel of the $(N-1)^{th}$ row.

The input electrode of the fourth transistor T4 included in the pixel of the $N^{th}$ row may be the first region A1 of the active pattern ATV. The input electrode of the seventh transistor T7(N−1) included in the pixel of the $(N-1)^{th}$ row may be the second region A2 of the active pattern ATV.

The scan line GW may be spaced apart from the initialization control line GI(N)/GB(N−1) in the second direction DR2. The scan line GW may extend in the first direction DR1. The scan line GW may overlap the active pattern ATV to define the second transistor T2 and the third transistor T3. A scan signal may be provided to the gate electrode of the second transistor T2 and the gate electrode of the third transistor T3 through the scan line GW.

The first storage electrode SE1 may be spaced apart from the scan line GW in the second direction DR2. The first storage electrode SE1 may overlap the active pattern ATV to define the first transistor T1. In addition, the first storage electrode SE1 may be a first electrode of the storage capacitor CST.

The light emission control line EM may be spaced apart from the first storage electrode SE1 in the second direction DR2. The light emission control line EM may overlap the active pattern ATV to define the fifth transistor T5 and the sixth transistor T6. A light emission control signal may be provided to the gate electrode of the fifth transistor T5 and the gate electrode of the sixth transistor T6 through the light emission control line EM.

The first dummy portion D1 may be disposed between the initialization control line GI(N)/GB(N−1) and the scan line GW. The first dummy portion D1 may be spaced apart from the conductive portion. In an embodiment, for example, the first dummy portion D1 may be spaced apart from the initialization control line GI(N)/GB(N−1) and the scan line GW. The first dummy portion D1 may not overlap the first region A1 and the second region A2 of the active pattern ATV. The first dummy portion D1 may overlap the third region A3 of the active pattern ATV.

Referring again to FIG. 6, the second conductive pattern C2 as a second conductive pattern layer may include a first horizontal initialization voltage line VINT1_H, a second horizontal initialization voltage line VINT2_H, a first stabilization electrode P1, and a second storage electrode SE2.

The first horizontal initialization voltage line VINT1_H may extend in the first direction DR1. The second horizontal initialization voltage line VINT2_H may be spaced apart from the first horizontal initialization voltage line VINT1_H in the second direction DR2. The second horizontal initialization voltage line VINT2_H may extend in the first direction DR1. The first stabilization electrode P1 may be spaced apart from the second horizontal initialization voltage line VINT2_H in the second direction DR2. The second storage electrode SE2 may be spaced apart from the first stabilization electrode P1 in the second direction DR2. The second storage electrode SE2 may extend in the first direction DR1. The second storage electrode SE2 may have a groove or opening formed through the second storage electrode SE2 when viewed in a plan view. The second storage electrode SE2 may be a second electrode of the storage capacitor CST.

Referring again to FIGS. 7 and 8, the third conductive pattern C3 as a third conductive pattern layer may include a data line DATA, a first power voltage line ELVDD, a first vertical initialization voltage line VINT1_V, a second vertical initialization voltage line VINT2_V, a first bridge electrode V1, a second bridge electrode V2, and a third bridge electrode V3.

The data line DATA may extend in the second direction DR2. The data line DATA may be electrically connected to the active pattern ATV. A data signal may be provided to the input electrode of the second transistor T2 through the data line DATA.

The first power voltage line ELVDD may be spaced apart from the data line DATA in the first direction DR1. The first power voltage line ELVDD may extend in the second direction DR2. The first power voltage line ELVDD may be electrically connected to the active pattern ATV, the first stabilization electrode P1, and the second storage electrode SE2. A first power voltage may be provided to the input electrode of the fifth transistor T5, the second electrode of the storage capacitor CST, and the first stabilization electrode P1 through the first power voltage line ELVDD.

The first bridge electrode V1 may be spaced apart from the first power voltage line ELVDD in the first direction DR1. The first bridge electrode V1 may be electrically connected to the active pattern ATV and the first storage electrode SE1. The first bridge electrode V1 may connect the gate electrode of the first transistor T1 and the output electrode of the fourth transistor T4.

The second bridge electrode V2 may be spaced apart from the first power voltage line ELVDD in the first direction DR1. The second bridge electrode V2 may be electrically connected to the active pattern ATV and the first horizontal initialization voltage line VINT1_H. The second bridge electrode V2 may connect the input electrode of the fourth transistor T4 (for example, the first region A1 of the active pattern ATV) and the first horizontal initialization voltage line VINT1_H.

The second vertical initialization voltage line VINT2_V may be spaced apart from the first bridge electrode V1 in the first direction DR1. The second vertical initialization voltage line VINT2_V may extend in the second direction DR2. The second vertical initialization voltage line VINT2_V may be electrically connected to the active pattern ATV and the second horizontal initialization voltage line VINT2_H. A second initialization voltage may be provided to the input electrode of the seventh transistor T7(N−1) (for example, the second region A2 of the active pattern ATV) included in the pixel of the (N−1)$^{th}$ row through the second vertical initialization voltage line VINT2_V.

The first vertical initialization voltage line VINT1_V may be spaced apart from the second vertical initialization voltage line VINT2_V in the first direction DR1. The first vertical initialization voltage line VINT1_V may be electrically connected to the active pattern ATV and the first horizontal initialization voltage line VINT1_H. A first initialization voltage may be provided to the input electrode of the fourth transistor T4 (for example, the first region A1 of the active pattern ATV) included in the pixel of the N$^{th}$ row through the first vertical initialization voltage line VINT1_V, the first horizontal initialization voltage line VINT1_H, and the second bridge electrode V2.

The third bridge electrode V3 may be spaced apart from the first vertical initialization voltage line VINT1_V in the first direction DR1. The third bridge electrode V3 may be electrically connected to the active pattern ATV and the second horizontal initialization voltage line VINT2_V.

Referring again to FIGS. 3 to 9, the first dummy portion D1 of the first conductive pattern C1 may be electrically insulated from the active pattern ATV, the second conductive pattern C2, the third conductive pattern C3, and a remaining portion of the first conductive pattern C1 including the initialization control line GI(N)/GB(N−1), the scan line GW, the first storage electrode SE1, and the light emission control line EM. In an embodiment, for example, the first dummy portion D1 and the active pattern ATV may be electrically insulated by the first insulating layer IL', the first dummy portion D1 and the second conductive pattern C2 may be electrically insulated by the second insulating layer IL2, the first dummy portion D1 and the initialization control line GI(N)/GB(N−1) may be electrically insulated by the first and second insulating layers IL1 and IL2, and the first dummy portion D1 and the scan line GW may be electrically insulated by the first and second insulating layers IL1 and IL2.

Figure 10:
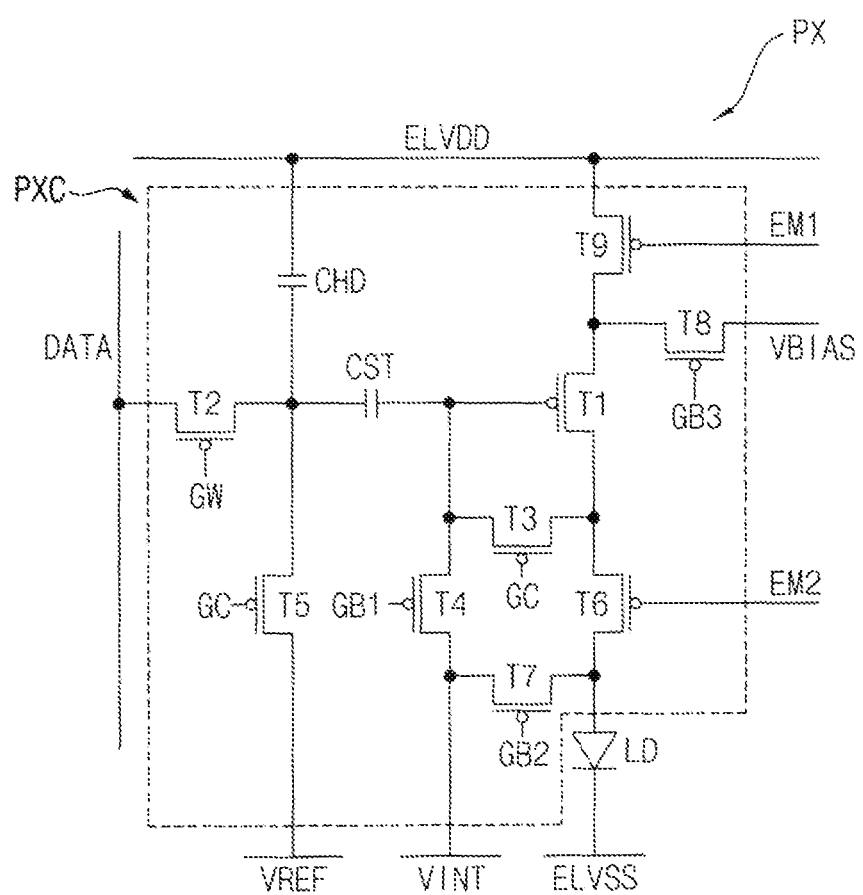
FIG. 10 is a circuit diagram illustrating an embodiment of a pixel shown in FIG. 1.

FIG. 10 is a circuit diagram illustrating an embodiment of the pixel PX shown in FIG. 1.

Referring to FIG. 10, the pixel PX may include the pixel circuit PXC and the light emitting diode LD. The pixel circuit PXC may include first to ninth transistors T1, T2, T3, T4, T5, T6, T7, T8, and T9, a storage capacitor CST, and a hold capacitor CHD.

The first transistor T1 may be electrically connected between the first power voltage line ELVDD and the anode electrode of the light emitting diode LD, and the gate electrode of the first transistor T1 may be connected to the first electrode of the storage capacitor CST. The first transistor T1 may provide a driving current corresponding to the data signal provided from the data line DATA to the light emitting diode LD. That is, the first transistor T1 may be a driving transistor.

The second transistor T2 may be connected between the data line DATA and the second electrode of the storage capacitor CST. The second transistor T2 may provide the data signal to the second electrode of the storage capacitor CST in response to the scan signal provided from the scan line GW. That is, the second transistor T2 may be a switching transistor.

The third transistor T3 may be connected between the gate electrode of the first transistor T1 and the output electrode of the first transistor T1. The third transistor T3 may compensate for a threshold voltage of the first transistor T1 by diode-connecting the first transistor T1 in response to a compensation control signal provided from a compensation control line GC. That is, the third transistor T3 may be a compensation transistor.

The fourth transistor T4 may be connected between the initialization voltage line VINT and the first electrode of the storage capacitor CST. The fourth transistor T4 may provide an initialization voltage provided from the initialization voltage line VINT to the gate electrode of the first transistor T1 in response to a first initialization control signal provided from the first initialization control line GB1. That is, the fourth transistor T4 may be a driving initialization transistor.

The fifth transistor T5 may be connected between the reference voltage line VREF and the second electrode of the storage capacitor CST. The fifth transistor T5 may provide a reference voltage provided from the reference voltage line VREF to the second electrode of the storage capacitor CST in response to the compensation control signal. That is, the fifth transistor T5 may be a reference transistor.

The sixth transistor T6 may be connected between the output electrode of the first transistor T1 and the anode electrode of the light emitting diode LD. The sixth transistor T6 may provide the driving current to the light emitting diode LD in response to a second light emission control signal provided from the second light emission control line EM2. That is, the sixth transistor T6 may be a light emission control transistor.

The seventh transistor T7 may be connected between the initialization voltage line VINT and the anode electrode of the light emitting diode LD. The seventh transistor T7 may provide the initialization voltage to the anode electrode of the light emitting diode LD in response to a second initialization control signal provided from the second initialization control line GB2. That is, the seventh transistor T7 may be a diode initialization transistor.

The eighth transistor T8 may be connected between a bias voltage line VBIAS and the input electrode of the first transistor T1. The eighth transistor T8 may provide a bias voltage provided from the bias voltage line VBIAS to the input electrode of the first transistor T1 in response to a third initialization control signal provided from the third initialization control line GB3. In an embodiment, the third initialization control signal may be the same as the second initialization control signal.

The ninth transistor T9 may be connected between the first power voltage line ELVDD and the input electrode of the first transistor T1. The ninth transistor T9 may provide a first power voltage provided from the first power voltage line ELVDD to the input electrode of the first transistor T1 in response to a first light emission control signal provided from the first light emission control line EM1. In an embodiment, the first light emission control signal and the second light emission control signal may have substantially the same signal waveform and mutually different signal timings.

In an embodiment, the input electrode and the output electrode of each of the transistors T1, T2, T3, T4, T5, T6, T7, T8, and T9 may be a source electrode and a drain electrode, respectively. However, the present disclosure is not limited thereto, and the input electrode and the output electrode of each of the transistors T1, T2, T3, T4, T5, T6, T7, T8, and T9 may be a drain electrode and a source electrode, respectively.

The hold capacitor CHD may be connected between the first power voltage line ELVDD and the second electrode of the storage capacitor CST. The hold capacitor CHD may hold a voltage between the first power voltage line ELVDD and the second electrode of the storage capacitor CST.

The storage capacitor CST may be connected between the gate electrode of the first transistor T1 and the output electrode of the second transistor T2. The storage capacitor CST may hold a voltage between the gate electrode of the first transistor T1 and the output electrode of the second transistor T2.

Figure 11:
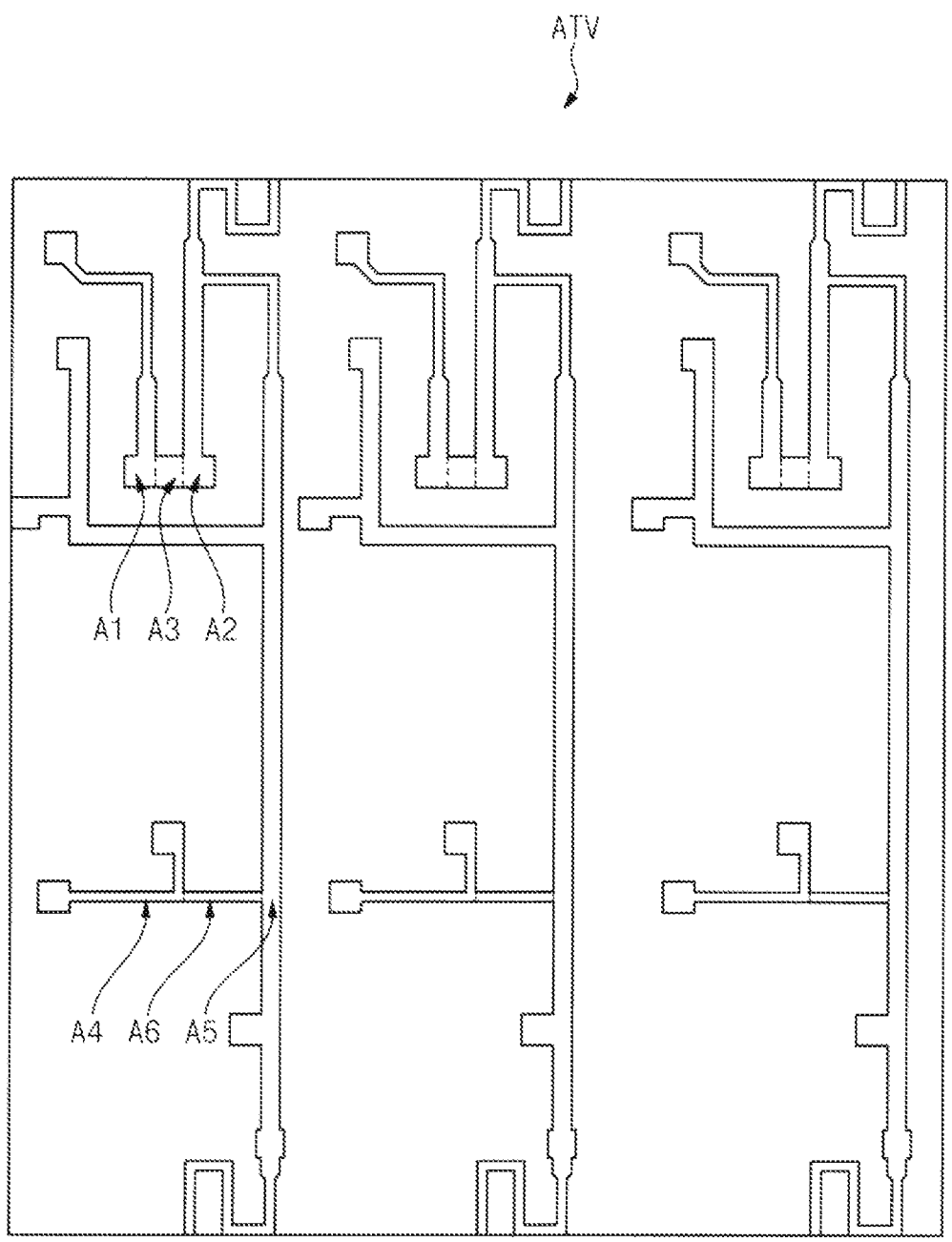
Figure 12:
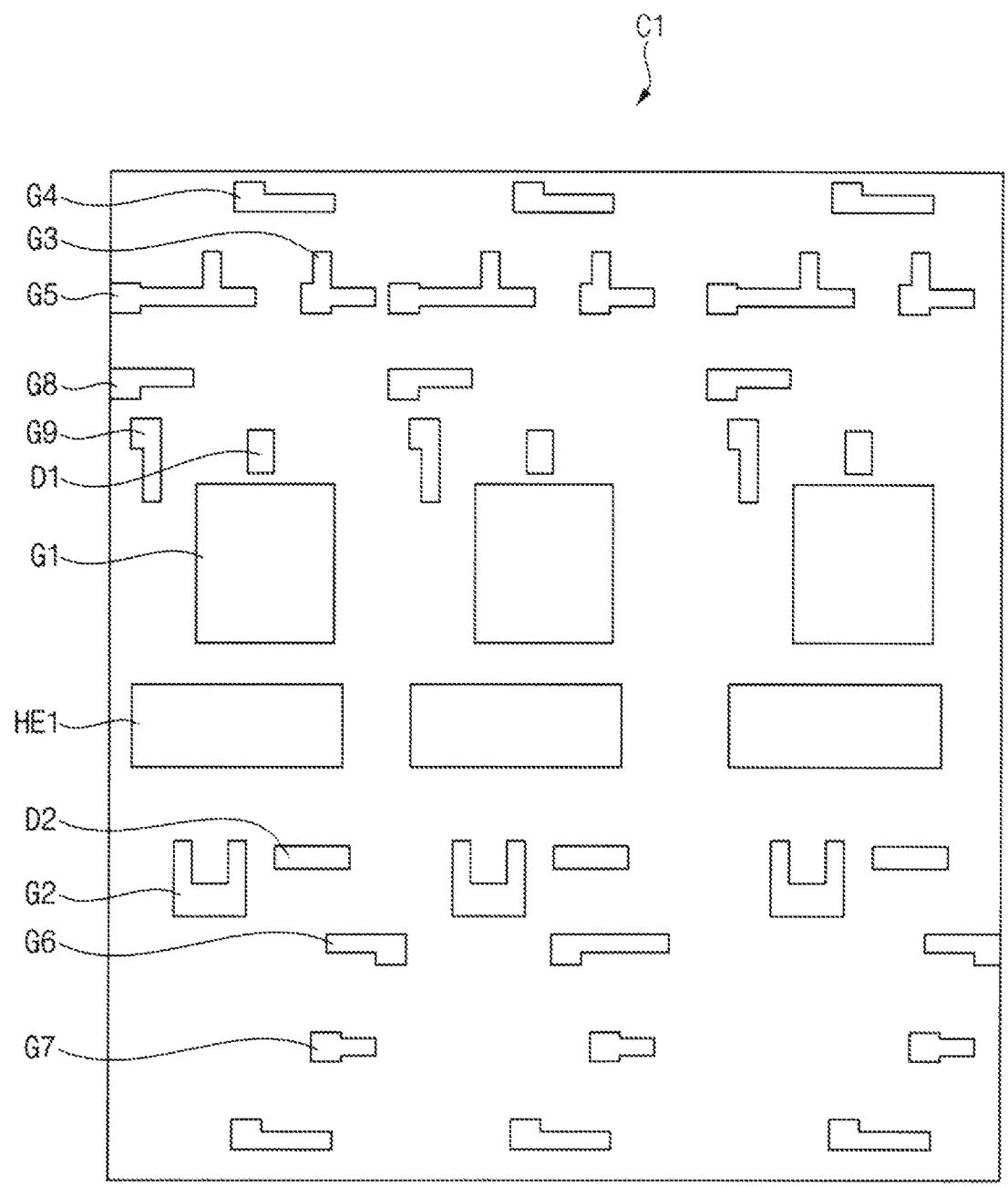
Figure 13:
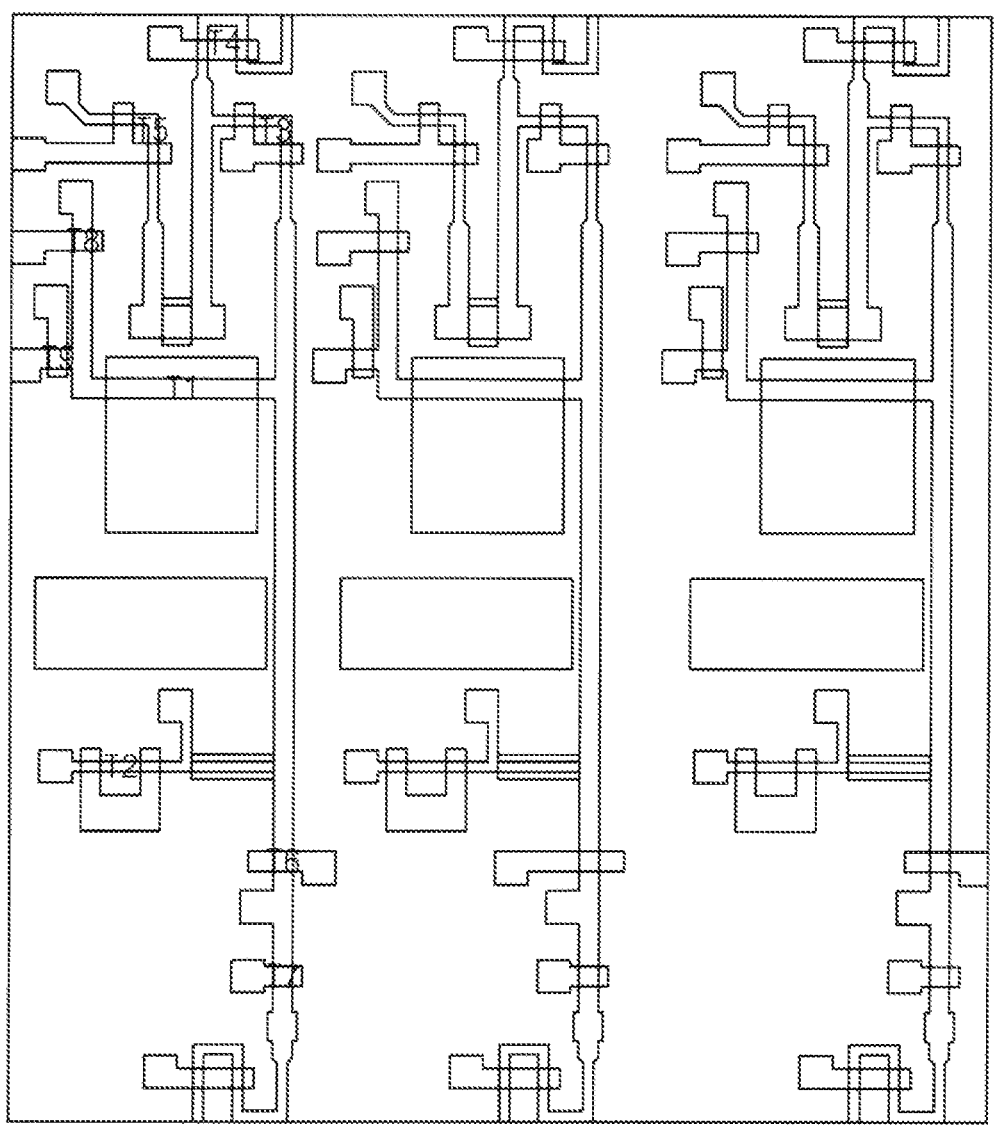
Figure 14:
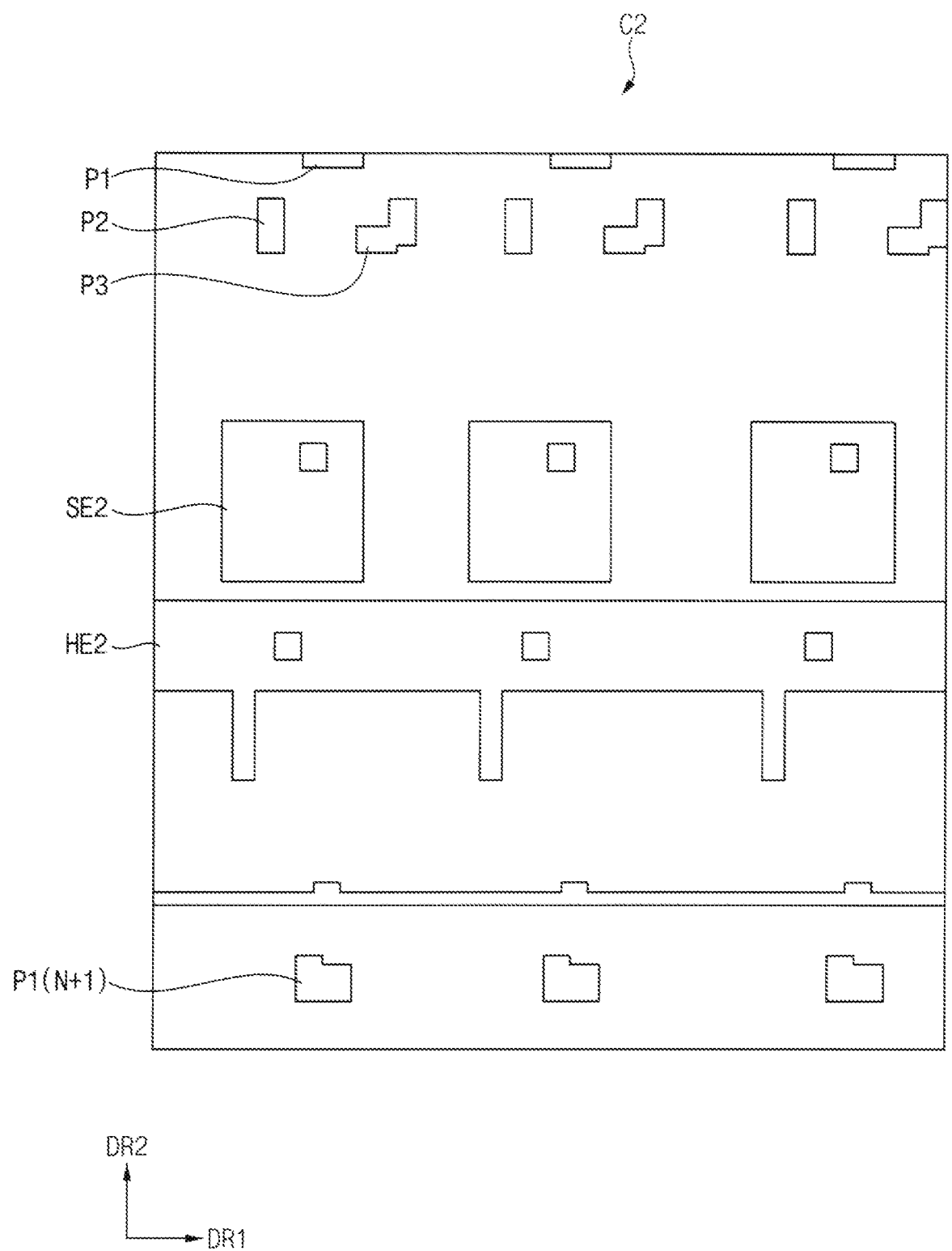
Figure 15:
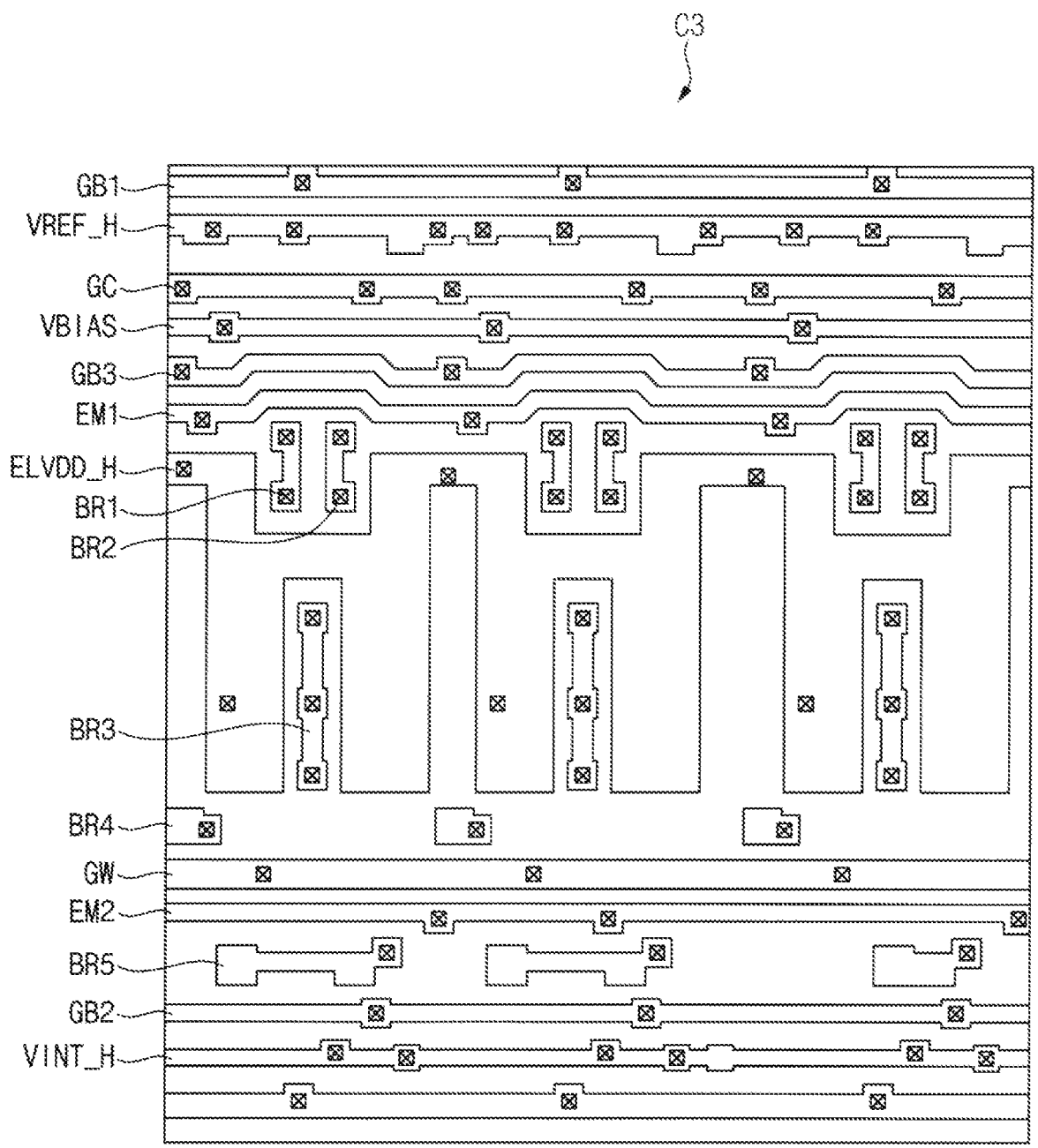
Figure 16:
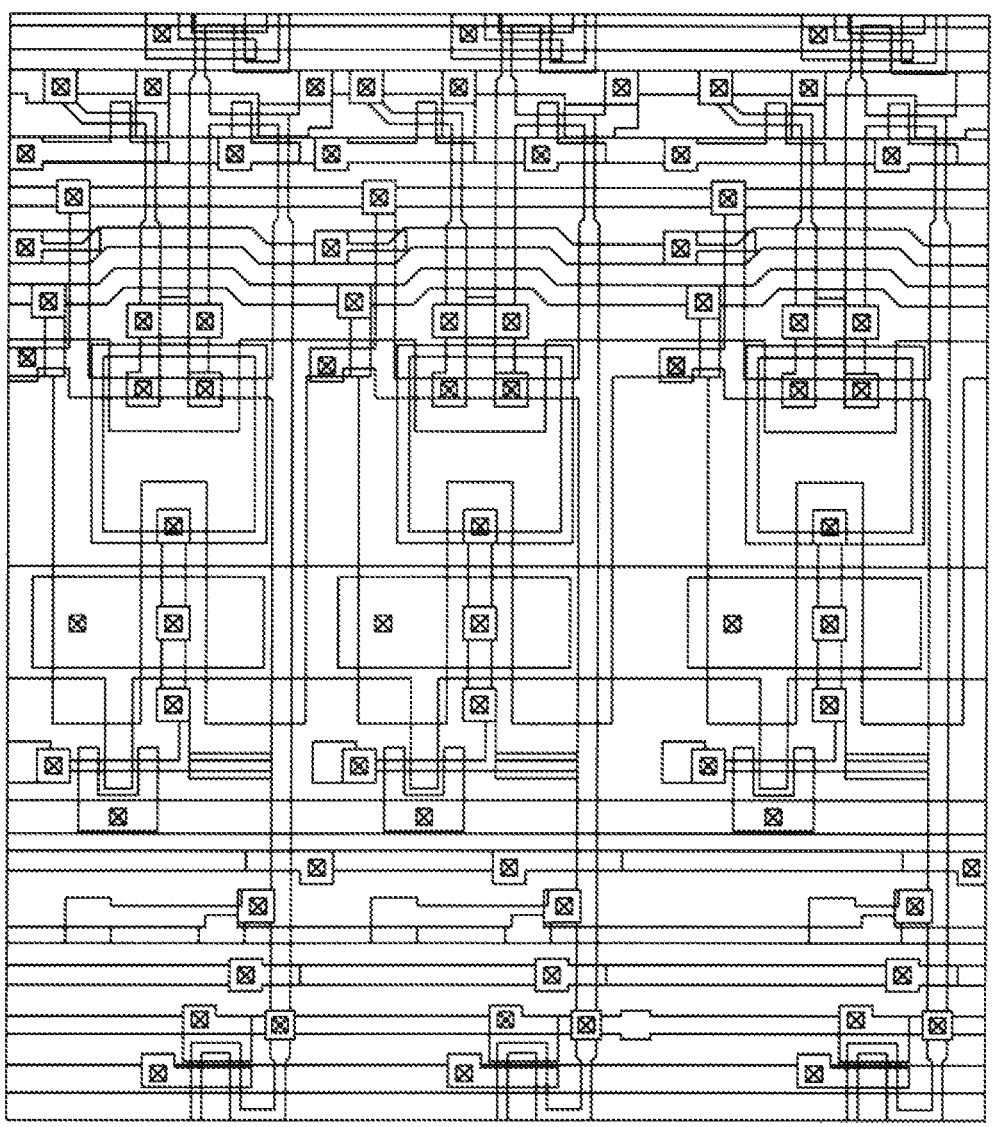
Figure 17:
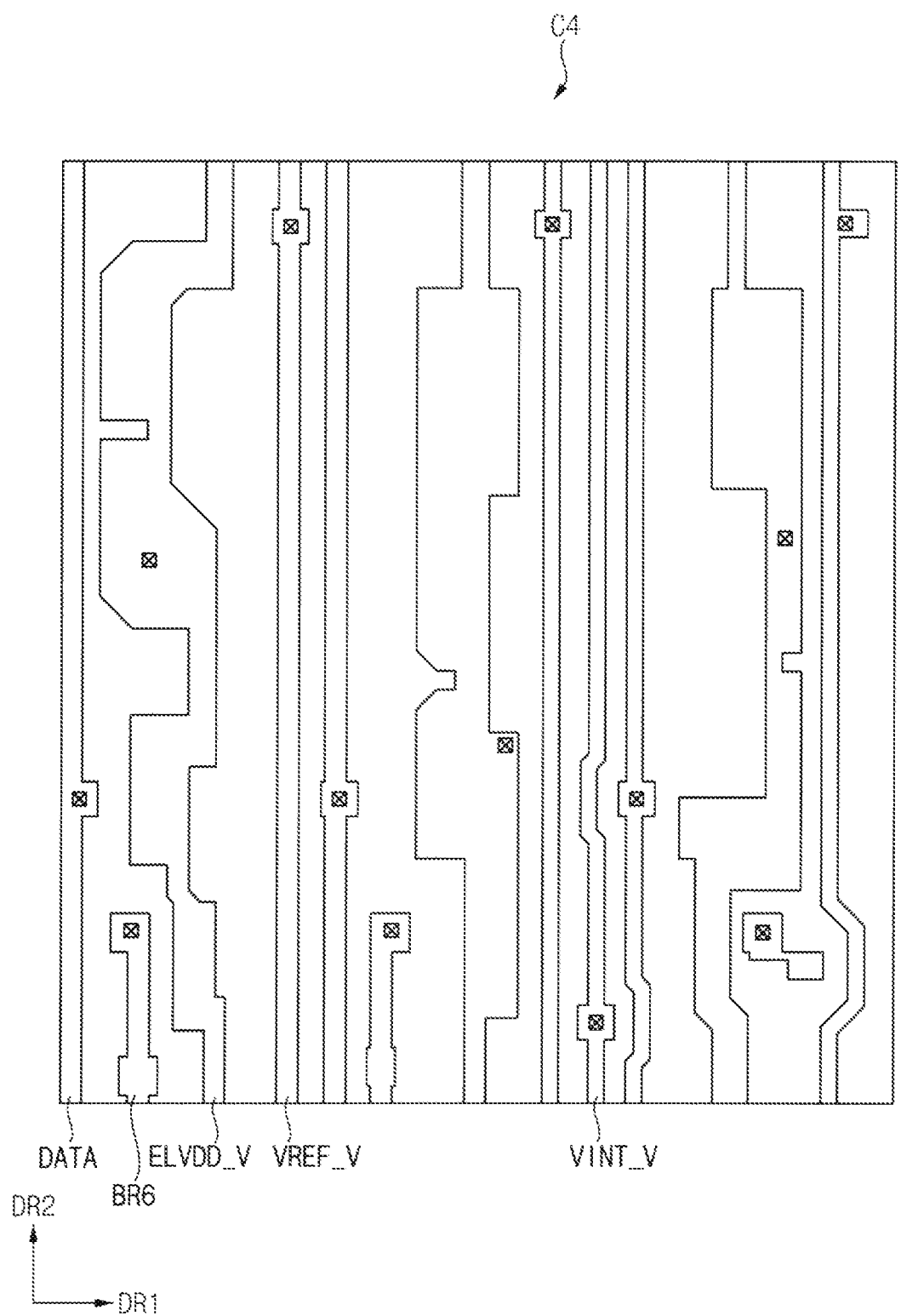
Figure 19:
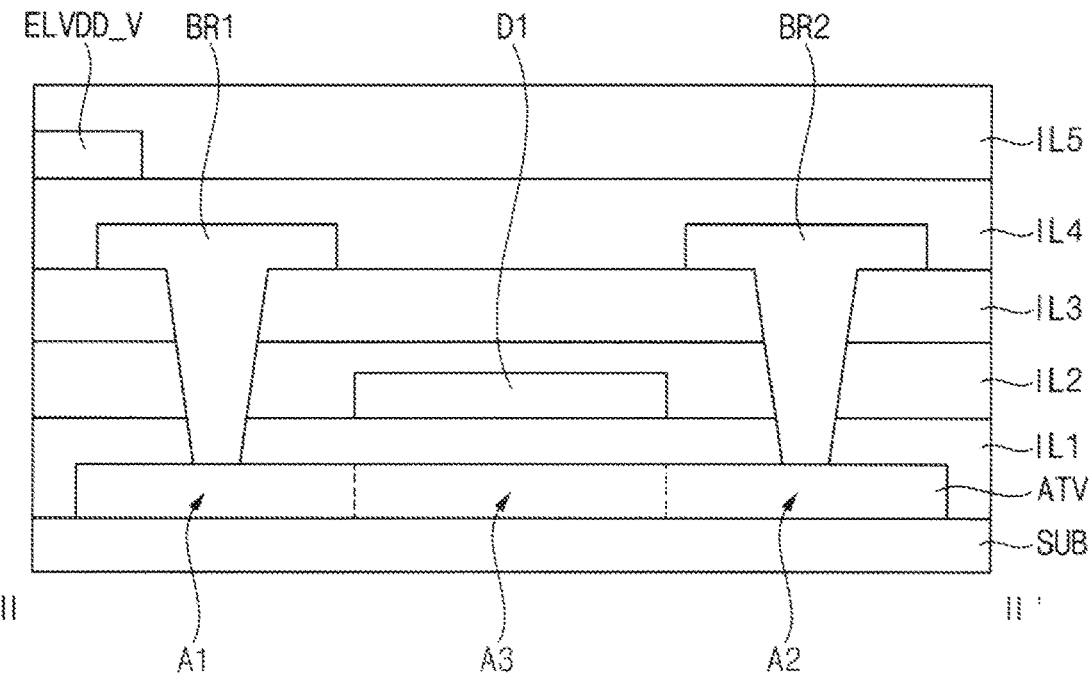
Figure 20:
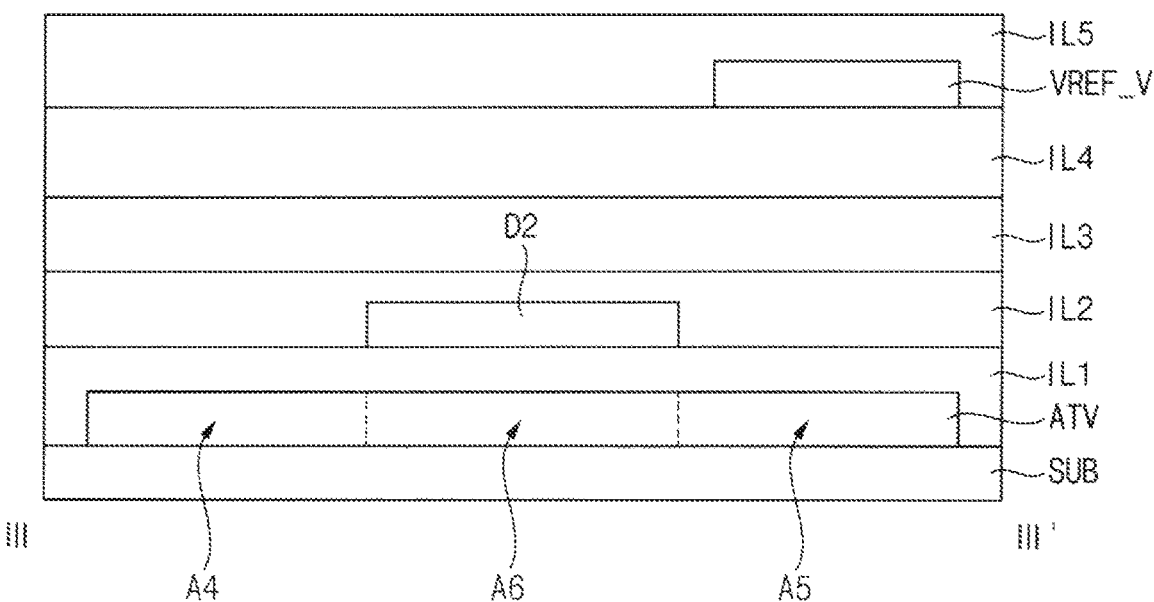

FIGS. 11 to 20 are views for explaining an embodiment of a pixel circuit PXC included in a plurality of pixels PX adjacent to each other. FIG. 11 is a plan view illustrating an embodiment of the active pattern ATV. FIG. 12 is a plan view illustrating an embodiment of the first conductive pattern C1. FIG. 13 is a plan view illustrating an embodiment of the active pattern ATV relative to the first conductive pattern C1. FIG. 14 is a plan view illustrating an embodiment of the second conductive pattern C2. FIG. 15 is a plan view illustrating an embodiment of the third conductive pattern C3. FIG. 16 is a plan view illustrating an embodiment of the active pattern ATV, the first conductive pattern C1, the second conductive pattern C2, and the third conductive pattern C3 together. FIG. 17 is a plan view illustrating an embodiment of the fourth conductive pattern C4. FIG. 18 is a plan view illustrating an embodiment of the active pattern ATV, the first conductive pattern C1, the second conductive pattern C2, the third conductive pattern C3, and the fourth conductive pattern C4 together. FIG. 19 is a cross-sectional view taken along line II-H' of FIG. 18. FIG. 20 is a sectional view taken along line III-HP of FIG. 18.

Referring to FIGS. 11 to 20, the pixel circuit may include a substrate SUB, an active pattern ATV disposed on the substrate SUB, a first conductive pattern C1 disposed on the active pattern ATV, and a plurality of conductive patterns disposed on the first conductive pattern C1. The plurality of conductive patterns may include a second conductive pattern C2 disposed on the first conductive pattern C1, a third conductive pattern C3 disposed on the second conductive pattern C2, and a fourth conductive pattern C4 disposed on the third conductive pattern C3.

A first insulating layer IL1 may be disposed between the active pattern ATV and the first conductive pattern C1. A second insulating layer IL2 may be disposed between the first conductive pattern C1 and the second conductive pattern C2. A third insulating layer IL3 may be disposed between the second conductive pattern C2 and the third conductive pattern C3. A fourth insulating layer IL4 may be disposed between the third conductive pattern C3 and the fourth conductive pattern C4. A fifth insulating layer IL5 covering the fourth conductive pattern C4 may be disposed on the fourth insulating layer IL4.

The first to fourth conductive patterns C1, C2, C3, and C4 may include a conductive material. In an embodiment, for example, the conductive material may include a metal, an alloy, a metal nitride, a conductive metal oxide, a transparent conductive material, and the like.

Referring again to FIG. 11, the active pattern ATV may include polycrystalline silicon. Alternatively, the active pattern ATV may include an oxide semiconductor.

The active pattern ATV may include a first region A1, a second region A2, and a third region A3. The second region A2 may be spaced apart from the first region A1. The third region A3 may be positioned between the first region A1 and the second region A2. In one embodiment, the first region A1 may be an output electrode of the fifth transistor T5, and the second region A2 may be an output electrode of the third transistor T3 and an output electrode of the fourth transistor T4.

The third region A3 may have relatively low electrical conductivity. Thus, the third region A3 of the active pattern ATV may electrically insulate the first region A1 of the active pattern ATV from the second region A2 of the active pattern ATV.

The active pattern ATV may further include a fourth region A4, a fifth region A5, and a sixth region A6. The fourth region A4 may be spaced apart from the fifth region A5. The sixth region A6 may be positioned between the fourth region A4 and the fifth region A5. In an embodiment, the fourth region A4 may be an output electrode of the second transistor T2, and the fifth region A5 may be an input electrode of the sixth transistor T6.

The sixth region A6 may have relatively low electrical conductivity. Thus, the sixth region A6 of the active pattern ATV may electrically insulate the fourth region A4 of the active pattern ATV from the fifth region A5 of the active pattern ATV.

Referring again to FIGS. 12 and 13, the first conductive pattern C1 may include first and second dummy portions D1 and D2 and a conductive portion spaced apart from the first and second dummy portions D1 and D2. The conductive portion may include first to ninth gate electrodes G1, G2, G3, G4, G5, G6, G7, G8, and G9 and a first hold electrode HE1.

The first to ninth gate electrodes G1, G2, G3, G4, G5, G6, G7, G8, and G9 overlap the active pattern ATV to define first to ninth transistors T1, T2, T3, T4, T5, T6, T7, T8, and T9. The first gate electrode G1 may be a first electrode of the storage capacitor CST.

In an embodiment, for example, the output electrode of the fifth transistor T5 may be the first region A1 of the active pattern ATV, and the gate electrode of the fifth transistor T5 may be the fifth gate electrode G5.

In an embodiment, for example, the output electrode of the third transistor T3 may be the second region A2 of the active pattern ATV, and the gate electrode of the third transistor T3 may be the third gate electrode G3.

In an embodiment, for example, the output electrode of the fourth transistor T4 may be the second region A2 of the active pattern ATV, and the gate electrode of the fourth transistor T4 may be the fourth gate electrode G4.

In an embodiment, for example, the output electrode of the second transistor T2 may be the fourth region A4 of the active pattern ATV, and the gate electrode of the second transistor T2 may be the second gate electrode G2.

In an embodiment, for example, the input electrode of the sixth transistor T6 may be the fifth region A5 of the active pattern ATV, and the gate electrode of the sixth transistor T6 may be the sixth gate electrode G6.

The first hold electrode HE1 may be a first electrode of the hold capacitor CHD. The first hold electrode HE1 may not overlap the active pattern ATV.

The first dummy portion D1 may be spaced apart from the first gate electrode G1 in the second direction DR2. The first dummy portion D1 may not overlap the first region A1 and the second region A2 of the active pattern ATV. The first dummy portion D1 may overlap the third region A3 of the active pattern ATV.

The second dummy portion D2 may be spaced apart from the second gate electrode G2 in the first direction DR1. The second dummy portion D2 may not overlap the fourth region A4 and the fifth region A5 of the active pattern ATV. The second dummy portion D2 may overlap the sixth region A6 of the active pattern ATV.

Referring again to FIG. 14, the second conductive pattern C2 may include a second storage electrode SE2, a second hold electrode HE2, and first to third stabilization electrodes P1, P2, and P3.

The second storage electrode SE2 may overlap the first gate electrode G1. The second storage electrode SE2 may include a groove formed through the second storage electrode SE2 when viewed in a plan view. The second storage electrode SE2 may be a second electrode of the storage capacitor CST.

The second hold electrode HE2 may overlap the first hold electrode HE1. The second hold electrode HE2 may include a groove formed through the second hold electrode HE2 when viewed in a plan view. The second hold electrode HE2 may be a second electrode of the hold capacitor CHD.

Referring again to FIGS. 15 and 16, the third conductive pattern C3 may include first to third initialization control lines GB1, GB2, and GB3, a horizontal reference voltage line VREF_H, a compensation control line GC, a bias voltage line VBIAS, first and second light emission control lines EM1 and EM2, first horizontal power voltage line ELVDD H, first to fifth bridge electrodes BR1, BR2, BR3, BR4, and BR5, a scan line GW, and a horizontal initialization voltage line VINT_H.

The first initialization control line GB1 may extend in the first direction DR1. The first initialization control line GB1 may be electrically connected to the fourth gate electrode G4. A first initialization control signal may be provided to the gate electrode of the fourth transistor T4 through the first initialization control line GB1.

The horizontal reference voltage line VREF_H may extend in the first direction DR1. The horizontal reference voltage line VREF_H may be spaced apart from the first initialization control line GB1 in the second direction DR2. The horizontal reference voltage line VREF_H may be electrically connected to the active pattern ATV, the second stabilization electrode P2, and the third stabilization electrode P3. A reference voltage may be provided to the input electrode of the fifth transistor T5, the second stabilization electrode P2, and the third stabilization electrode P3 through the horizontal reference voltage line VREF_H.

The compensation control line GC may extend in the first direction DR1. The compensation control line GC may be spaced apart from the horizontal reference voltage line VREF_H in the second direction DR2. The compensation control line GC may be electrically connected to the third gate electrode G3 and the fifth gate electrode G5. A compensation control signal may be provided to the gate electrode of the third transistor T3 and the gate electrode of the fifth transistor T5 through the compensation control line GC.

The bias voltage line VBIAS may extend in the first direction DR1. The bias voltage line VBIAS may be spaced apart from the compensation control line GC in the second direction DR2. The bias voltage line VBIAS may be electrically connected to the active pattern ATV. A bias voltage may be provided to the input electrode of the eighth transistor T8 through the bias voltage line VBIAS.

The third initialization control line GB3 may extend in the first direction DR1. The third initialization control line GB3 may be spaced apart from the bias voltage line VBIAS in the second direction DR2. The third initialization control line GB3 may be electrically connected to the eighth gate electrode G8. A third initialization control signal may be provided to the gate electrode of the eighth transistor T8 through the third initialization control line GB3.

The first light emission control line EM1 may extend in the first direction DR1. The first light emission control line EM1 may be spaced apart from the third initialization control line GB3 in the second direction DR2. The first light emission control line EM1 may be electrically connected to the ninth gate electrode G9. A first light emission control signal may be provided to the gate electrode of the ninth transistor T9 through the first light emission control line EM1.

The first horizontal power voltage line ELVDD H may be spaced apart from the first light emission control line EM1 in the second direction DR2. The first horizontal power voltage line ELVDD H may be electrically connected to the second hold electrode HE2 and the active pattern ATV. A first power voltage may be provided to the second electrode of the hold capacitor CHD and the input electrode of the ninth transistor T9 through the first horizontal power voltage line ELVDD H.

The scan line GW may extend in the first direction DR1. The scan line GW may be spaced apart from the first horizontal power voltage line ELVDD H in the second direction DR2. The scan line GW may be electrically connected to the second gate electrode G2. A scan signal may be provided to the gate electrode of the second transistor T2 through the scan line GW.

The second light emission control line EM2 may extend in the first direction DR1. The second light emission control line EM2 may be spaced apart from the scan line GW in the second direction DR2. The second light emission control line EM2 may be electrically connected to the sixth gate electrode G6. A second light emission control signal may be provided to the gate electrode of the sixth transistor T6 through the second light emission control line EM2.

The second initialization control line GB2 may extend in the first direction DR1. The second initialization control line GB2 may be spaced apart from the second light emission control line EM2 in the second direction DR2. The second initialization control line GB2 may be electrically connected to the seventh gate electrode G7. A second initialization signal may be provided to the gate electrode of the seventh transistor T7 through the second initialization control line GB2.

The horizontal initialization voltage line VINT_H may extend in the first direction DR1. The horizontal initialization voltage line VINT_H may be spaced apart from the second initialization control line GB2 in the second direction DR2. The horizontal initialization voltage line VINT_H may be electrically connected to the active pattern ATV and the first stabilization pattern P1(N+1) included in the pixel of the (N+1)$^{th}$ row. An initialization voltage may be provided to the input electrode of the seventh transistor T7 through the horizontal initialization voltage line VINT_H.

The first bridge electrode BR1 may be electrically connected to the active pattern ATV and the second storage electrode SE2. The first bridge electrode BR1 may connect the output electrode of the fifth transistor T5 (for example, the first region A1 of the active pattern ATV) and the second storage electrode SE2.

The second bridge electrode BR2 may be electrically connected to the active pattern ATV and the first gate electrode G1. The second bridge electrode BR2 may connect the output electrode of the fourth transistor T4 (for example, the second region A2 of the active pattern ATV) and the gate electrode of the first transistor T1.

The third bridge electrode BR3 may be electrically connected to the active pattern ATV, the second storage electrode SE2, and the first hold electrode HE'. The third bridge electrode BR3 may connect the output electrode of the second transistor T2, the second electrode of the storage capacitor CST, and the first electrode of the hold capacitor CHD.

The fourth bridge electrode BR4 may be electrically connected to the active pattern ATV. The fourth bridge electrode BR4 may be electrically connected to the input electrode of the second transistor T2.

The fifth bridge electrode BR5 may be electrically connected to the active pattern ATV.

Referring again to FIGS. 17 and 18, the fourth conductive pattern C4 as a fourth conductive pattern layer may include a data line DATA, a sixth bridge electrode BR6, a first vertical power voltage line ELVDD V, a vertical reference voltage line VREF_V, and a vertical initialization voltage line VINT V.

The data line DATA may extend in the second direction DR2. The data line DATA may be electrically connected to the fourth bridge electrode BR4. A data signal may be provided to the input electrode of the second transistor T2 electrically connected to the fourth bridge electrode BR4 through the data line DATA.

The first vertical power voltage line ELVDD V may extend in the second direction DR2. The first vertical power voltage line ELVDD V may be spaced apart from the data line DATA in the first direction DR1. The first vertical power voltage line ELVDD V may be electrically connected to the first horizontal power voltage line ELVDD H.

The vertical reference voltage line VREF_V may extend in the second direction DR2. The vertical reference voltage line VREF_V may be spaced apart from the first vertical power voltage line ELVDD V in the first direction DR1. The vertical reference voltage line VREF_V may be electrically connected to the horizontal reference voltage line VREF_H.

The vertical initialization voltage line VINT V may extend in the second direction DR2. The vertical initialization voltage line VINT V may be spaced apart from the vertical reference voltage line VREF_V in the first direction DR1. The vertical initialization voltage line VINT V may be electrically connected to the horizontal initialization voltage line VINT_H.

The sixth bridge electrode BR6 may be electrically connected to the fifth bridge electrode BR5 and the anode electrode of the light emitting diode LD.

Referring again to FIGS. 10 to 20, the first dummy portion D1 of the first conductive pattern C1 may be electrically insulated from the active pattern ATV, the second conductive pattern C2, the third conductive pattern C3, the fourth conductive pattern C4, and a remaining portion of the first conductive pattern C1 including first to the ninth gate electrodes G1, G2, G3, G4, G5, G6, G7, G8, and G9, the first hold electrode HE1, and the second dummy portion D2.

In addition, the second dummy portion D2 of the first conductive pattern C1 may be electrically insulated from the active pattern ATV, the second conductive pattern C2, the third conductive pattern C3, the fourth conductive pattern C4, and a remaining portion of the first conductive pattern C1 including first to ninth gate electrodes G1, G2, G3, G4, G5, G6, G7, G8, and G9, the first hold electrode HE1, and the first dummy portion D1.

FIGS. 21 to 26 are cross-sectional views illustrating an embodiment of a method of providing or manufacturing a display device 1000.

Figure 21:
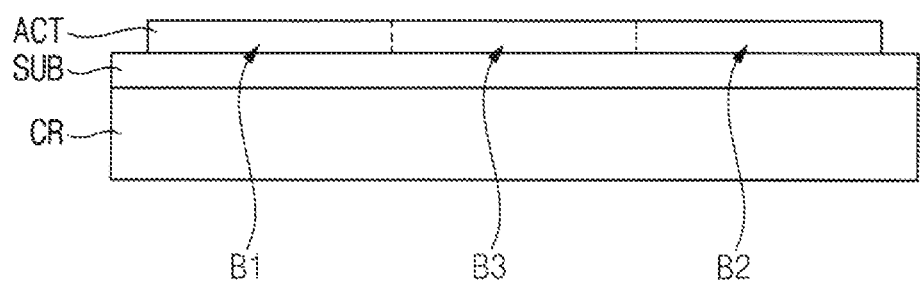
FIGS. 21 to 26 are sectional views illustrating an embodiment of a method of providing a display device.

Referring to FIG. 21, the substrate SUB may be formed (or provided) on a carrier substrate CR, and the active pattern ACT may be formed on the substrate SUB. The active pattern ACT may be substantially the same as the active pattern ATV described with reference to FIGS. 2 to 20.

The active pattern ACT may include a first region B1, a second region B2 spaced apart from the first region B1, and a third region B3 disposed between the first region B1 and the second region B2.

In an embodiment, for example, the first region B1 and the second region B2 of the active pattern ACT may be substantially the same as the first region A1 and the second region A2 of the active pattern ATV described with reference to FIGS. 2 to 9, and the third region B3 of the active pattern ACT may be substantially the same as the third region A3 of the active pattern ATV described with reference to FIGS. 2 to 9.

As another example, the first region B1 and the second region B2 of the active pattern ACT may be substantially the same as the first region A1 and the second region A2 of the active pattern ATV described with reference to FIGS. 10 to 20, and the third region B3 of the active pattern ACT may be substantially the same as the third region A3 of the active pattern ATV described with reference to FIGS. 10 to 20.

As still another example, the first region B1 and the second region B2 of the active pattern ACT may be substantially the same as the fourth region A4 and the fifth region A5 of the active pattern ATV described with reference to FIGS. 10 to 20, and the third region B3 of the active pattern ACT may be substantially the same as the sixth region A6 of the active pattern ATV described with reference to FIGS. 10 to 20.

Figure 22:
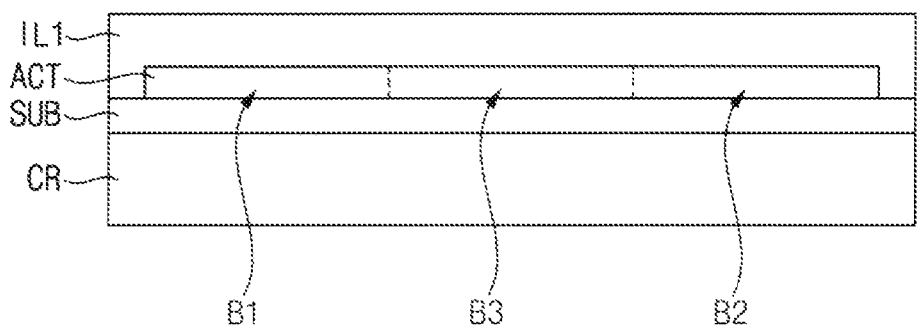

Referring to FIG. 22, the first insulating layer IL1 covering the active pattern ACT may be formed on the substrate SUB. The first insulating layer IL1 may include an inorganic insulating material.

Figure 23:
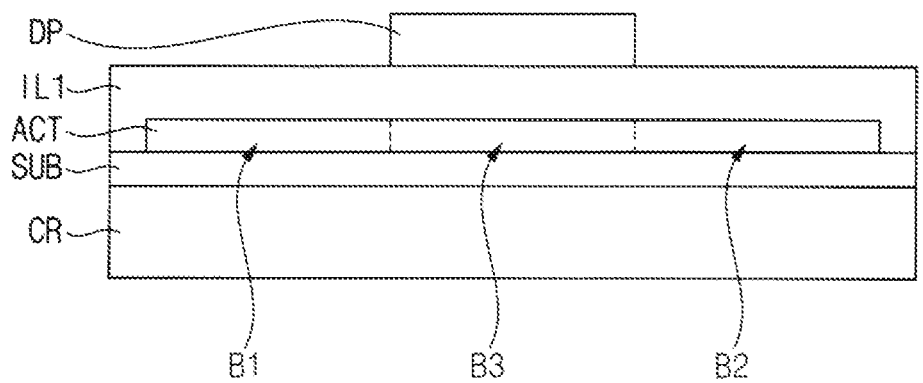

Referring to FIG. 23, the first conductive pattern layer may be formed on the substrate SUB. The first conductive pattern layer may be substantially the same as the first conductive pattern C1 described with reference to FIGS. 2 to 9. Alternatively, the first conductive pattern layer may be substantially the same as the first conductive pattern C1 described with reference to FIGS. 10 to 20.

The first conductive pattern layer may include the dummy portion DP overlapping the third region B3 of the active pattern ACT and the conductive portion of the first conductive pattern C1 which is spaced apart from the dummy portion DP. The dummy portion DP may not overlap the first region B1 and the second region B2 of the active pattern ACT.

In an embodiment, for example, the dummy portion DP may be the first dummy portion D1 described with reference to FIGS. 2 to 9, and the conductive portion which is spaced apart from the dummy portion DP may be the initialization control line GI(N)/GB(N-1), the scan line GW, the first storage electrode SE1, and the light emission control line EM described with reference to FIGS. 2 to 9.

As another example, the dummy portion DP may be the first dummy portion D1 described with reference to FIGS. 10 to 20, and the conductive portion which is spaced apart from the dummy portion DP may be the first to ninth gate electrodes G1, G2, G3, G4, G5, G6, G7, G8, and G9 and the first hold electrode HE1 described with reference to FIGS. 10 to 20.

As still another example, the dummy portion DP may be the second dummy portion D2 described with reference to FIGS. 10 to 20, and the conductive portion which is spaced apart from the dummy portion DP may be the first to ninth gate electrodes G1, G2, G3, G4, G5, G6, G7, G8, and G9 and the first hold electrode HE1 described with reference to FIGS. 10 to 20.

Figure 24:
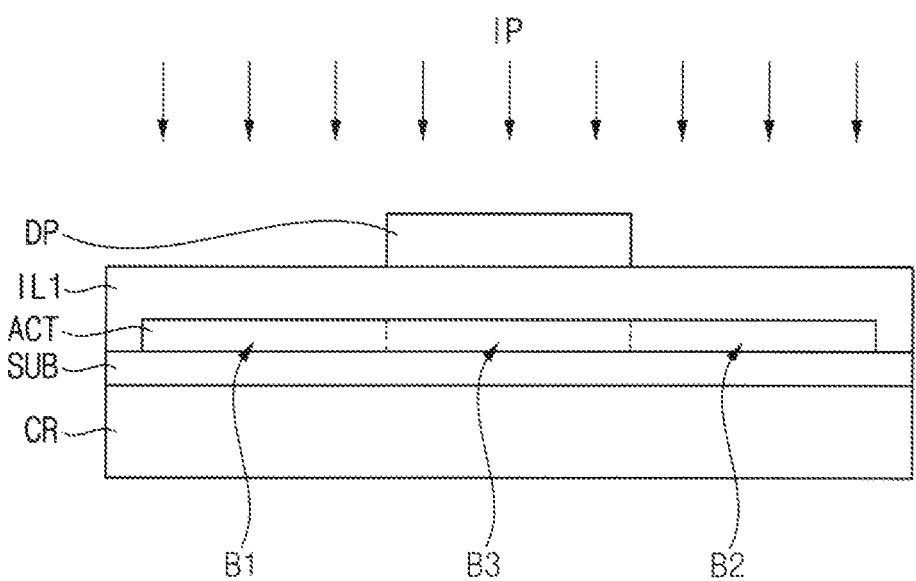

Referring to FIG. 24, the active pattern ACT may be doped with impurities IP using the first conductive pattern layer as a mask. In this case, the impurities IP may not be doped in a region of the active pattern ACT that overlaps the first conductive pattern layer. There is no limitation in the method of doping the impurities IP, and various known methods may be used.

Figure 25:
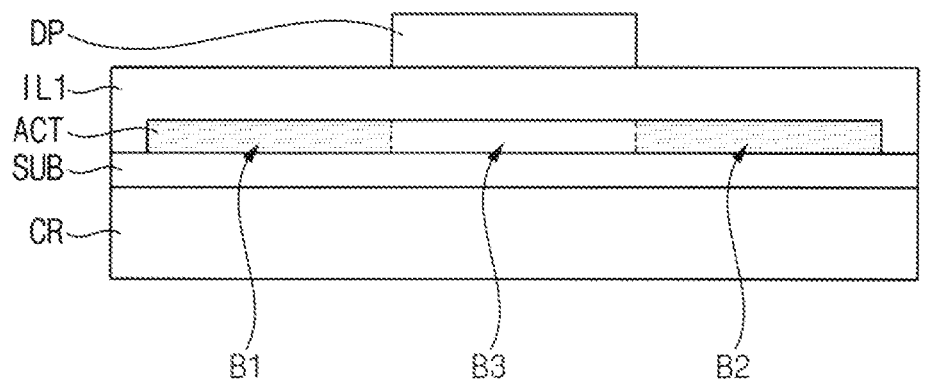

Referring to FIG. 25, since the dummy portion DP overlaps the third region B3 of the active pattern ACT, the impurities IP may not be doped into the third region B3 of the active pattern ACT or the third region B3 may have a very low doping level (e.g., undoped region or low-doped region).

The first region B1 and the second region B2 of the active pattern ACT may not overlap the first conductive pattern layer (e.g., may be exposed outside of the active pattern ACT), and accordingly, the first region B1 and the second region B2 of the active pattern ACT may be doped with impurities IP to define a doped region of the active pattern ACT. That is, the first region B1 and the second region B2 of the active pattern ACT extend further than the dummy portion DP of the first conductive pattern layer in a direction along the first conductive pattern layer.

Accordingly, the third region B3 of the active pattern ACT may have relatively low electrical conductivity, and the third region B3 of the active pattern ACT electrically insulates the first region B1 of the active pattern ACT from the second region B2 of the active pattern ACT.

Figure 26:
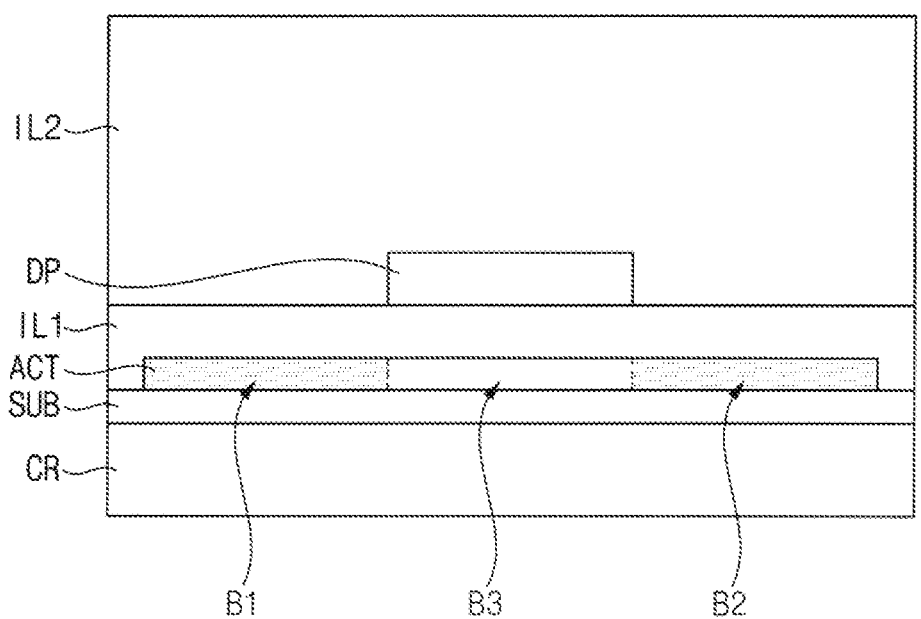

Referring to FIG. 26, a second insulating layer IL2 may be formed on the first insulating layer IL1. The second insulating layer IL2 shown in FIG. 26 may include a plurality of insulating layers sequentially stacked. Along a thickness direction of the second insulating layer IL2 including a plurality of insulating layers, the second insulating layer IL2 shown in FIG. 26 may further include a conductive pattern disposed between two insulating layers adjacent to each other among the plurality of insulating layers.

In an embodiment, for example, the conductive pattern within the plurality of insulating layers of the thickness of the second insulating layer IL2 shown in FIG. 26 may include the second conductive pattern C2 and the third conductive pattern C3 described with reference to FIGS. 2 to 9. That is, a plurality of second conductive patterns (e.g., the second conductive pattern C2 and the third conductive pattern C3) may be in order from the substrate SUB.

As another example, the conductive pattern within the plurality of insulating layers of the thickness of the second insulating layer IL2 shown in FIG. 26 may include the second conductive pattern C2, the third conductive pattern C3, and the fourth conductive pattern C4 described with reference to FIGS. 10 to 20. That is, a plurality of second conductive patterns (e.g., the second conductive pattern C2, the third conductive pattern C3, and the fourth conductive pattern C4) may be in order from the substrate SUB In this case, within the second insulating layer IL2 shown in FIG. 26, the dummy portion DP may be electrically insulated from the active pattern ACT and the conductive pattern.

Although embodiments of the display device 1000 and the method of providing the display device 1000 of the present disclosure have been described above with reference to the drawings, the described embodiments are illustrative purpose only and may be modified and changed by those of ordinary skill in the art within the technical idea of the present disclosure as set forth in the claims below.

One or more embodiment of a display device 1000 and a method of providing the display device 1000 of the present disclosure may be applied to a display device 1000 including a computer, a mobile phone, a smart phone, a smart pad, and the like, and a method of providing (or manufacturing) thereof.

What is claimed is:

1. A display device comprising:
   a substrate; and
   a pixel circuit comprising:
   a transistor defined by an active pattern and a first conductive pattern, and
   in order from the substrate:
      the active pattern including a first region, a second region spaced apart from the first region, and a third region between the first region and the second region;
      a first conductive pattern layer including the first conductive pattern and a first dummy portion spaced apart from each other; and
      a plurality of second conductive patterns in order from the substrate,
      wherein within the transistor of the pixel circuit, the first dummy portion of the first conductive pattern layer overlaps the third region of the active pattern and is electrically insulated from the plurality of second conductive patterns and the active pattern.

2. The display device of claim 1, wherein in a direction along the substrate, the third region of the active pattern electrically insulates the first region of the active pattern from the second region of the active pattern.

3. The display device of claim 1, wherein the first region and the second region of the active pattern extend further than the first dummy portion of the first conductive pattern layer.

4. The display device of claim 1, wherein within the first conductive pattern layer, the first dummy portion is electrically insulated from the first conductive pattern.

5. The display device of claim 1, wherein the plurality of second conductive patterns include in order from the substrate:
   a second conductive pattern layer; and
   a third conductive pattern layer.

6. The display device of claim 5, wherein the plurality of second conductive patterns further include in order from the substrate, a fourth conductive pattern layer.

7. The display device of claim 1, wherein the pixel circuit further comprises:
   a driving transistor which generates a driving current and includes a gate electrode;
   a light emitting element which emits light based on the driving current and includes an anode electrode;
   a driving initialization transistor which provides a first initialization voltage to the gate electrode of the driving transistor; and
   a diode initialization transistor which provides a second initialization voltage different from the first initialization voltage to the anode electrode of the light emitting element and within the transistor which is defined by the active pattern and the first conductive pattern, the first region of the active pattern is an input electrode of the driving initialization transistor and the second region of the active pattern is an input electrode of the diode initialization transistor.

8. The display device of claim 7, wherein
   the first region of the active pattern is an input electrode of the driving initialization transistor, and
   the second region of the active pattern is an input electrode of the diode initialization transistor.

9. The display device of claim 7, wherein the pixel circuit further comprises:
   a first initialization voltage line which transmits the first initialization voltage and is electrically connected to the first region of the active pattern; and
   a second initialization voltage line which transmits the second initialization voltage and is electrically connected to the second region of the active pattern.

10. The display device of claim 1, wherein the pixel circuit further comprises:
    a driving transistor which generates a driving current and includes a gate electrode;
    a storage capacitor including a first electrode connected to the gate electrode of the driving transistor and a second electrode which overlaps the first electrode;
    a light emitting element which emits light based on the driving current;
    an initialization transistor which provides an initialization voltage to the first electrode of the storage capacitor; and
    a reference transistor which provides a reference voltage to the second electrode of the storage capacitor.

11. The display device of claim 10, wherein
    the first region of the active pattern is an output electrode of the reference transistor, and
    the second region of the active pattern is an output electrode of the initialization transistor.

12. The display device of claim 11, wherein
    each of the initialization transistor and the reference transistor includes an input electrode; and
    the pixel circuit further comprises:
       an initialization voltage line which transmits the initialization voltage and is electrically connected to the input electrode of the initialization transistor; and
       a reference voltage line which transmits the reference voltage and is electrically connected to the input electrode of the reference transistor.

13. The display device of claim 10, wherein
    the active pattern further includes a fourth region, a fifth region spaced apart from the fourth region, and a sixth region between the fourth region and the fifth region,
    the first conductive pattern layer further includes a second dummy portion overlapping the sixth region of the active pattern, and
    within the pixel circuit, the second dummy portion of the first conductive pattern layer is electrically insulated from the plurality of second conductive patterns and the active pattern.

14. The display device of claim 13, wherein the pixel circuit further comprises:
    a switching transistor which provides a data voltage to the second electrode of the storage capacitor; and a light emission control transistor which receives the driving current from the driving transistor and transfers the driving current to the light emitting element.

15. The display device of claim 14, wherein the fourth region of the active pattern is an output electrode of the switching transistor, and the fifth region of the active pattern is an input electrode of the light emission control transistor.

* * * * *